United States Patent [19]
Sakashita et al.

[11] Patent Number: 5,109,190
[45] Date of Patent: Apr. 28, 1992

[54] SEMICONDUCTOR APPARATUS INCLUDING SEMICONDUCTOR INTEGRATED CIRCUIT AND OPERATING METHOD THEREOF

[75] Inventors: Kazuhiro Sakashita; Takeshi Hashizume, both of Hyogo, Japan

[73] Assignee: Mitsubishi Denki Kabushiki Kaisha, Tokyo, Japan

[21] Appl. No.: 658,032

[22] Filed: Feb. 22, 1991

[30] Foreign Application Priority Data

Feb. 26, 1990 [JP] Japan .................................. 2-46569

[51] Int. Cl.$^5$ .......................................... G01R 31/28
[52] U.S. Cl. .............................. 324/158 R; 324/73.1; 371/22.3; 371/25.1
[58] Field of Search ............ 324/158 R, 73.1, 158 T; 371/22.1, 22.3, 25.1

[56] References Cited

U.S. PATENT DOCUMENTS

| | | | |
|---|---|---|---|
| 4,945,536 | 7/1990 | Hancu | 371/22.3 |
| 4,963,824 | 10/1990 | Hsieh et al. | 324/158 R |
| 4,967,142 | 10/1990 | Sauerwald et al. | 324/73.1 |
| 5,001,713 | 3/1991 | Whetsel | 371/22.3 |

FOREIGN PATENT DOCUMENTS 3630679  4/1987  Fed. Rep. of Germany .

OTHER PUBLICATIONS

"IEEE Standard Test Access Port and Boundary-Scan Architecture", IEEE Std. 1149.1-1990, May 21, 1990.
"Standard Test Access Port and Boundary-Scan Architecture", Sponsor: Test Technology Technical Committee of the IEEE Computer Society, Jun. 20, 1989.

*Primary Examiner*—Ernest F. Karlsen
*Attorney, Agent, or Firm*—Lowe, Price, LeBlanc & Becker

[57] ABSTRACT

A semiconductor apparatus including a semiconductor integrated circuit is disclosed. The semiconductor integrated circuit includes a circuit block, a plurality of boundary scan registers, a system data terminal, a test signal terminal and a control circuit. The control circuit responds to a test signal to generate control signals (a select signal LT, shift clock signals SCLK1 and SCLK2, a capture clock signal CPCLK and an update clock signal UPCLK) for controlling the boundary scan registers. The boundary scan registers are connected in cascade to each other and each connected to the circuit block. Each boundary scan register includes a selector circuit (12) and latch circuits (13, 14, 15). The latch circuit (13) responds to the shift clock signal SCLK1 to shift data of an adjacent preceding boundary scan register, an also responds to the update clock signal UPCLK to capture data from the selector circuit (12). The selector circuit (12) responds to the select signal LT to select system data or test data. The latch circuit (14) responds to the shift clock signal SCLK2 to shift the captured data to an adjacent succeeding boundary scan register. The latch circuit (15) responds only to the update clock signal UPCLK to apply the selected data to the circuit block.

14 Claims, 17 Drawing Sheets

LT

SCLK1

CPCLK

UPCLK

SCLK2

ISCLK1

ISCLK2

ICPCLX

FIG.3(ℓ)
 IUPCLK

SEMICONDUCTOR APPARATUS INCLUDING SEMICONDUCTOR INTEGRATED CIRCUIT AND OPERATING METHOD THEREOF

BACKGROUND OF THE INVENTION

1. Field of the Invention

The present invention relates generally to test circuit devices for integrated circuit devices and, more particularly, to a test circuit device for facilitating a connection test in and between integrated circuits.

2. Description of the Background Art

Recent development of surface mounting technique has rendered tests (mainly in-circuit tests) of printed boards difficult.

In the in-circuit test, after chips have been mounted on a board, probes of spring type arranged with spacings of several millimeters are applied onto a rear surface of a substrate so as to individually test every chip for the test of the board. Because of the recent development of the surface mounting technique, however, the in-circuit test has such a problem that the probes can not be applied to terminals of the chips. Further, specially manufactured jigs may often be too expensive. In order to solve these problems, such a boundary scan has conventionally been employed that a scan design, as used for facilitating an internal test of a chip, is extended to a board level. The boundary scan is a method in which a shift register including a latch circuit is connected to an input/output of each chip to form a serial connection for establishing a scan path. This method is described in detail in, for example, IEEE p. 1149 1/D5, drafted on June 20, 1989 and entitled "IEEE Standard Test Access Port and Boundary-Scan Architecture". This article is standardized by The Institute of Electrical and Electronics Engineers on May 21, 1990.

FIG. 15 is a block diagram of a board including chips which are experimentally designed by the boundary scan in the above article.

Referring to FIG. 15, there are provided at edges of a board 1, input/output terminals 2 for operating a system between the board 1 and other boards, a scan input terminal 3 for supplying test data as an input, a scan output terminal 4 for supplying test data as an output, and so forth. A plurality of chips 5 are mounted on the board 1. Circuit blocks 6, boundary scan registers 7, control circuits 8 and the like are integrated in the chips 5. Each circuit block 6 is connected to input/output terminals 9 arranged at the peripheries of the chip 5 through boundary scan registers 7. The input/output terminals 9 are connected through system signal lines 10 to the other input/output terminals 9 or input/output terminals 2 of the board. The abovedescribed control circuits 8 each generate control signals for performing an operation test (internal test) of the chips 5, a connection test (external test) between the chips 5 and an operation test (sample test) of the entire board by employing the boundary scan registers 7. The control circuits 8 also generate control signals for performing a normal operation. Further, the control circuits 8 transmit a test signal from the scan input terminal 3 or another chip 5 and supply as an output test data from the scan output terminal 4 onto a test signal line 11.

FIG. 16 is a block diagram of the above-described chip 5. Referring to FIG. 16, the boundary scan registers 7 are each connected through input/output buffers 9' to the input/output terminals 9 of the chip 5. The control circuit 8 receives through shift paths 11 test data TDI, a test mode select signal TMS and a test clock signal TCK. The control circuit 8 responds to these signals to generate clock signals SCLK1, SCLK2, UPCLK and CPCLK for controlling the boundary scan registers 7 and also generate a signal LT for switching data input terminals DI and scan input terminals SI of the boundary scan registers 7. The control circuit 8 applies the test data TDI through a scan output terminal SO to the data input terminals SI of the boundary scan registers 7 and also applies the clock signals SCLK1, SCLK2, UPCLK and CPCLK and the control signal LT to the boundary scan registers 7. Each of the boundary scan registers 7 responds to a control signal from the control circuit 8 to select either the input terminal DI connected to each input/output terminal 9 of the chip 5 or the scan input terminal SI connected to each output terminal SO of the control circuit 8 and also select either the scan output terminal SO or a data output terminal DO. The test data supplied from the scan output terminal SO of the boundary scan register 7 is sequentially shifted by the boundary scan register 7. The shifted test data is then applied to the scan input terminal SI of the control circuit 8. The control circuit 8 outputs the scan-input test data through a test data output port TDO at a predetermined timing. FIG. 19 shows the waveforms of the control signal LT, test data SI, clock signals SCLK1, SCLK2, CPCLK and UPCLK generated by the control circuit 8, an input signal of the input terminal DI of the boundary scan register 7, the scan output terminals SO, and the data output terminals DO.

FIGS. 17A, 17B and 17C are block diagrams schematically showing the flow of test data in portions (a), (b) and (c) surrounded by a chain-dotted line. Referring to FIGS. 17A, 17B and 17C, a reference character 7i denotes a boundary scan register connected to an input terminal 9i of a chip 5, and 7o denotes a boundary scan register connected to an output terminal 9o of the chip 5. Although a plurality of boundary scan registers are provided, and all the boundary scan registers provided on the same chip are serially connected to form a single shift bus, only one input and one output are shown in the figures for simplification of the description. A description will now be made on the flow of test data in the above-described three types of tests with reference to those figures.

[I] Internal Test

Referring to FIG. 17(A), the shift bus transmits the test data, which is input to the scan-in terminal SI of the boundary scan register 7i connected to the input terminal 9i of the chip 5. As a result thereof, the data is set. The data set in the boundary scan register 7i is applied through the data output terminal DO of the boundary scan register 7i to the circuit block 6 and is processed therein. A processed result of the circuit block 6 is input to the data input terminal DI of the boundary scan register 7o connected to the output terminal 9o, and thus the data is set in the boundary scan register 7o. A processed result of the circuit block 6 set in the boundary scan register 7o is shifted-out through the scan terminal SO of the boundary scan register 7o. The shifted-out data is output through the shift bus and further through the test signal line 11 from the scan output terminal 4. The test output data output from the output terminal 4 may be observed to confirm whether the chip 5 will correctly operate or not.

[II] External Test

Referring to FIG. 17B, in order to perform the test of connection between the chips, the test data for the external test is shifted into the scan input terminal SI of the boundary scan register 7o connected to the output terminal 9o of the chip 5. As a result thereof, the test test data is output through the data output terminal DO to the output terminal 9o. This output data is applied through the system signal line 10 to the input terminal 9i of another chip. The test data input through the input terminal 9i of another chip 5 is captured in the boundary data is set in the boundary scan register 7o. The set scan register 7i connected to the input terminal 9i. The captured test data is shifted-out from the scan output terminal SO. Similarly to the internal test, the shifted-out data is output from the scan output terminal 4. The output test data may be observed to confirm the connection of the signal connection 10 between the chips 5. By this test, it is possible to test disconnection between the chips as well as openings and short-circuiting of the connection between the chips due to a failure of soldering between the chips and the board.

[III] Sample Test

By the internal test and the external test described above, it is possible to test the connections in and between the individual chips 5 forming the board 1. However, it is impossible to confirm the mutual effect of the chips 5 after the chips are mounted on the board 1 and the function thereof in the operation of the system. For the confirmation of those effect and function, the system (i.e., board) will be normally operated. In this operation, a signal at a node connected to the boundary scan register 7 is captured into the boundary scan register at a given timing without preventing the normal operation to observe them. This makes it possible to confirm the mutual effect of the circuits in the normal operation and the function thereof in the system operation. An operation of the sample test will be described below with reference to FIG. 17C.

The data input through the input terminal 9i of the chip 5 is input to the circuit block 6, and is simultaneously captured in the boundary scan registers 7i and 7o connected to the input terminal 9i and output terminal 9o, respectively, whereby the data is shifted-out from the scan output terminal SO without affecting the operation of the circuit block 6. Thus, the functions of the boundary scan register required for performing the internal and external tests are: (1) to capture the data input through each data input terminal DI into the boundary scan registers 7, (2) to shift the data from the scan input terminal SI to the scan output terminal SO, and (3) to apply the data held in the boundary scan register 7 to the data output terminal DO, (the functions (1), (2) and (3) will be called as CAPTURE, SHIFT and UPDATE hereinafter, respectively). The sample test requires the functions (1) and (2). For carrying out the sample test, the capture and shift operations themselves should not exert influence on the output terminals DO. The internal test and external test are carried out in the order of SHIFT→UPDATE→CAPTURE→SHIFT, and the sample test is carried out in the order of CAPTURE→SHIFT.

FIG. 18A is a circuit diagram specifically illustrating the above boundary scan register 7. Referring to FIG. 18, the boundary scan register 7 includes a selector circuit 12 having two inputs and one output, a latch circuit 13, a latch circuit 14 and a latch circuit 15 as well as the above-described data input terminal DI, scan input terminal SI, data output terminal DO and scan output terminal SO, and also includes input terminals 16, 17, 18, 19 and 20 of which inputs are the control signals LT, CPCLK forming the timing for CAPTURE, shift clocks SCLK1 and SCLK2 for shifting the input data and the clock signal UPCLK for outputting the data, respectively. The selector circuit 12 is a circuit for switching and selecting the input terminal D1 or D2 in accordance with the control signal LT from the control circuit 8. This circuit 12 includes an input terminal D2 connected to an output terminal Y of the latch circuit 14, an input terminal D1 connected to the data input terminal DI, a data output terminal D0 and an output terminal Y connected to an input terminal D1 of the latch circuit 13. The latch circuit 13 includes two data input terminals D1 and D2, and control terminals C1 and C2. The circuit 13 latches data input to the terminal D1 in response to the clock signal CPCLK input to the control terminal C1, and also latches the input data for the terminal D2 in response to the clock signal SCLK1 input to the terminal C2. To an input terminal D1 of the latch circuit 14 is connected the output terminal Y of the latch circuit 13 so as to latch the data in response to the clock signal SCLK2 input to the terminal C1. To an input terminal D1 of the latch circuit 15 is connected the output terminal Y of the latch circuit 13 so as to latch the data in response to the clock signal UPCLK input to the terminal C1.

A description will now be given of the path of test data in each of the operations (1) CAPTURE, (2) SHIFT and (3) UPDATE and the normal operation in the above test circuit device, with reference to FIGS. 18B, 18C, 18D and 19. The thick solid lines in FIGS. 18B, 18C and 18D denote data transmission paths. The hatched portions in FIG. 19 represent arbitrary conditions.

(1) CAPTURE

Referring to FIGS. 18B and 19, the selector circuit 12 selects the input terminal D1 in response to the control signal LT (low level) from the control circuit 8, whereby the signal from the data input terminal D1 is transmitted to the data output terminal DO. Then, the latch circuit 13 captures the data of the input terminal DI (i.e., the output data of the selector circuit 12 connected to this) in response to the capture clock CPCLK. The shift clock SCLK2 is then applied to the input terminal C1 of the latch circuit 14. In response to this clock SCLK2, the data latched in the latch circuit 13 is transmitted to the latch circuit 14.

(2) SHIFT

Referring to FIGS. 18C and 19, the non-overlapped clocks SCLK1 and SCLK2 of two phases cause the shift operation from the scan input terminal S1 to the scan output terminal S0. By this operation, the data captured in the latch circuits 13 and 14 in CAPTURE is shifted-out. Further, serial data is externally shifted-in the chip 5 and is held in the latch circuit 13.

(3) UPDATE

Referring to FIGS. 18D and 19, the data shifted-in from the scan input terminal Si in response to the nonoverlapped shift clocks SCLK1 and SCLK2 of two phases are held in the latch circuit 13 and the latch circuit 14. In order to output the shifted-in data SI from the data output terminal DO, the control circuit 8 sets the control signal LT at a high level. The selector circuit 12 responds to this control signal LT at the high level to select the input D2. Accordingly, the data held in the latch circuit 15 is output to the data output terminal DO. Then, the control circuit 8 applies the data output clock UPCLK to the terminal Cl of the latch circuit 15. The latch 15 responds to this data output clock UPCLK to capture the data Sl held in the latch circuit 13 and updates the data.

The normal operation is basically the same as the operation in the sample test, and the signal LT is always set at the low level. However, CAPTURE and SHIFT are not carried out, so that SCLK1, SCLK2, CPCLK, UPCLK, and signals at the terminals SI and SO are set at fixed values. In FIG. 19, SCLK1, SCLK2, and CPCLK are fixed at the low level, and UPCLK is fixed at the high level. Accordingly, the selector circuit 12 can be maintained at a state in which the terminal Dl is selected, and thus the signal input to the shift-in terminal SI will not exert any influence on the transmission of the data from the data input terminal DI to the data output terminal DO.

FIG. 20A is a circuit diagram showing another manner of the above-mentioned boundary scan register. Referring to FIG. 20A, input terminals as well as components thereof are the same as those in FIG. 18A, except for connections thereof. Although, in FIG. 18A, the input of the latch circuit 13 is connected to the output terminal of the selector circuit 12, the boundary scan register shown in FIG. 20A is designed to connect the input terminal of the latch circuit 13 to the data input terminal DI without through the selector circuit 12.

FIGS. 20B, 20C and 20D show the paths of test data, and FIG. 21 is a timing chart showing the operation in FIG. 20A.

The operation of this boundary scan register is the same at that in FIG. 18A except for the fact that the selector circuit 12 may be arbitrarily selected in the capturing operation. The boundary scan register 7 shown in FIG. 20A has the following advantages with respect to the test of the test circuit itself. That is; by the shift operation (shift test), it is possible to test a path between the scan input terminal SI and the scan output terminal SO (together with the shift functions of the latch circuits 13 and 14). Further, it is possible to confirm the bus from the data input terminal DI to the latch circuit 13 and the latch function of the latch circuit 13 by virtue of the capture operation. It is also possible by the update operation to confirm the bus from the output terminal Y of the latch circuit 13 to the latch circuit 15 and the bus therefrom to the data output terminal Do through the selector circuit 12 as well as the functions of the selector circuit 12 and the latch circuit 15.

By a series of these operations, the boundary scan register 7 can be tested.

However, in the capture operation of the boundary scan register 7 shown in FIG. 18A, the data to be latched is transmitted to the output terminal Do without any change at the same time as the data is latched in the latch circuit 13. If the boundary scan register 7 is connected to an output buffer 9', this capture operation causes simultaneous changes of the many output buffers 9'. The simultaneous changes of the output buffers cause a noise due to fluctuation of a source voltage, resulting in capturing of error data.

The boundary scan register in FIG. 20A can carry out the circuit test of the boundary scan register itself. However, a circuit test cannot be carried out at the path from the data input terminal DI to the input terminal Dl of the selector circuit 12. That is; it is impossible to test the path through which normal data (system data) is transmitted in the normal operation. Therefore, this path test can be carried out only by operating the whole chips in the system. The checking of this path is however, important, and thus, the insertion of this test circuit should not reduce a failure detectability.

SUMMARY OF THE INVENTION

One object of the invention is therefore to provide a semiconductor apparatus capable of preventing the capture of error test data in a capture operation.

Another object of the invention is to provide a semiconductor apparatus enabling the checking of a path from a system data terminal or a circuit block to a selecting circuit.

A further object of the invention is to provide an operating method in which the capture of error test data in a capture operation can be prevented.

Briefly, a semiconductor apparatus in accordance with the invention includes a semiconductor integrated circuit. The semiconductor integrated circuit includes a logic circuit, a plurality of registers, a system data terminal, a test signal terminal, and a controller. The registers are connected with each other in cascade and each connected to the logic circuit. The system data terminal is connected to the registers, to/from which system data is input/output. The test signal terminal is connected to the controller to apply a test signal to the controller. The controller responds to the test signal to generate a control signal for controlling the registers and test data. The control signal includes (i) a select signal, (ii) a capture clock signal, (iii) a shift clock signal, and (iv) a feed clock signal (update clock signal). Each of the registers further includes a shift-in circuit, a selector circuit, a capture circuit, a shift-out circuit, and a data feed circuit. The shift-in circuit responds to the shift clock signal to shift data from an adjacent preceding register. The selector circuit selects one of (1) data transmitted from the system data terminal or the logic circuit and (2) data shifted from the adjacent preceding register. The capture circuit responds to the capture clock signal to capture the system data or the data from the logic circuit. The shift-out circuit responds to the shift clock signal to shift the captured data to an adjacent succeeding register. The data feed circuit responds only to the feed clock signal (update clock signal) to apply the selected data to the system data terminal or the logic circuit.

In accordance with the invention described above, unlike the conventional example, the data selected by the selector circuit is applied to the data feed circuit. The applied data is not output until the feed clock signal is applied to the data feed circuit. This prevents simultaneous changes of a plurality of output buffers connected to the adjacent succeeding registers, thereby to prevent the capture of erroneous data.

In addition, since the data transmitted from the system data terminal or the logic circuit is applied to the capture circuit after selected by the selector circuit, the checking of the data captured by the capture circuit enables the checking of the path from the system data terminal or the logic circuit to the selector circuit.

The foregoing and other objects, features, aspects and advantages of the present invention will become more apparent from the following detailed description of the present invention when taken in conjunction with the accompanying drawings.

BRIEF OF THE DRAWINGS

Figure 4:
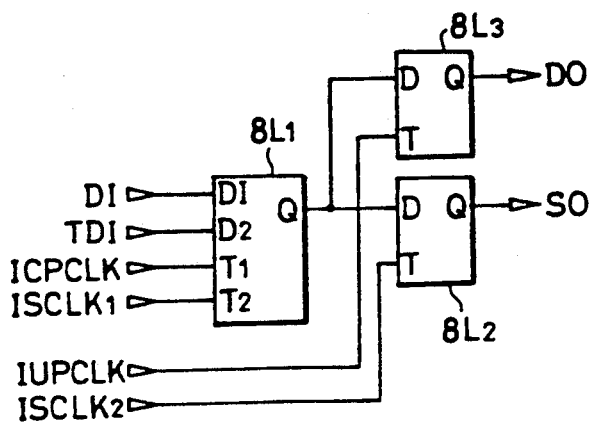
Figure 5:
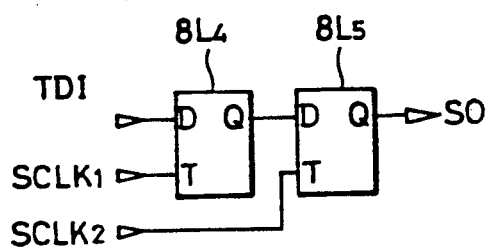
Figure 6A:
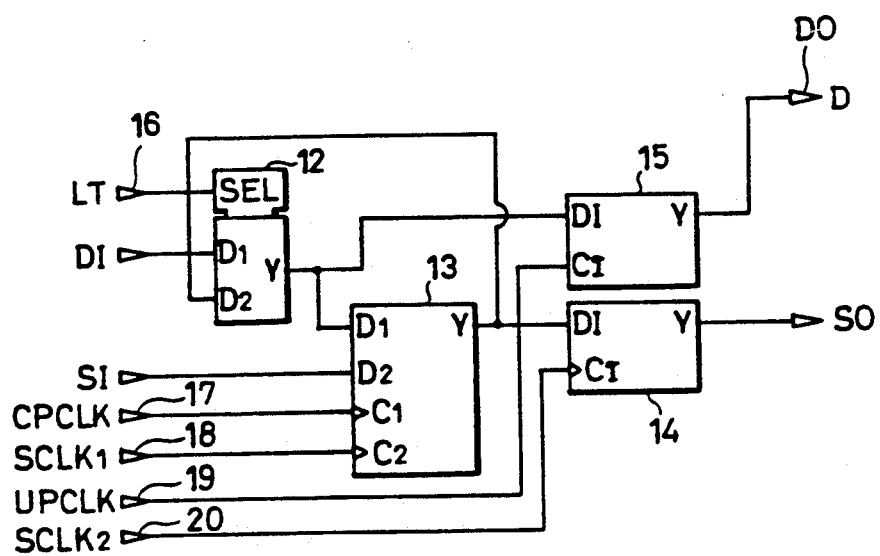
Figure 6B:
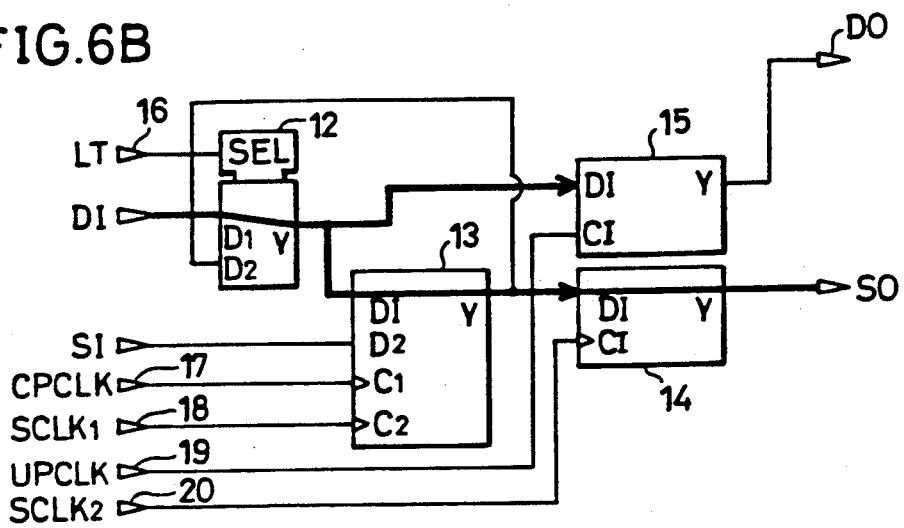
Figure 6C:
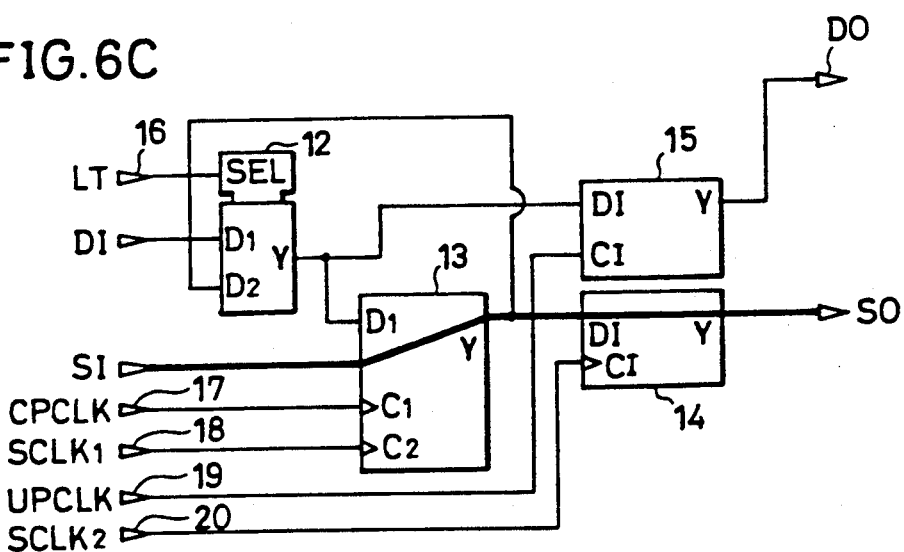
Figure 6D:
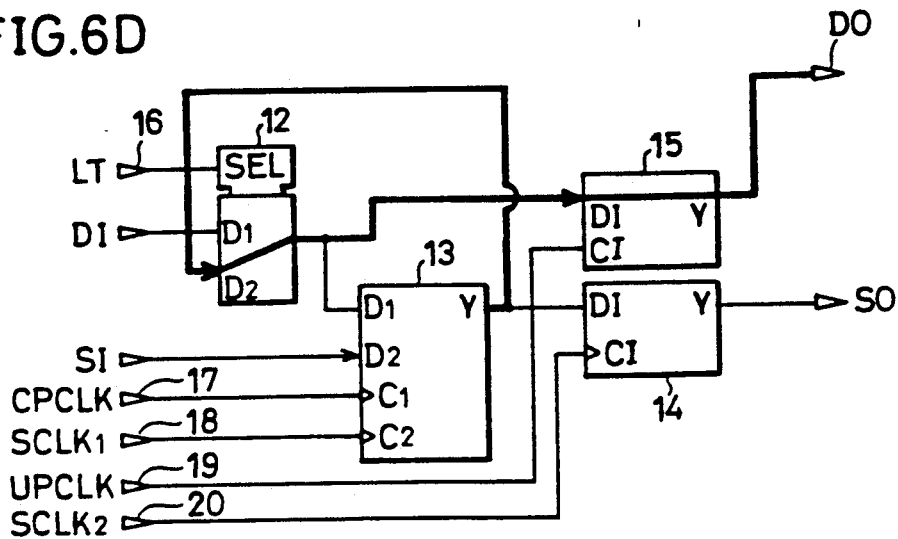
Figure 7:
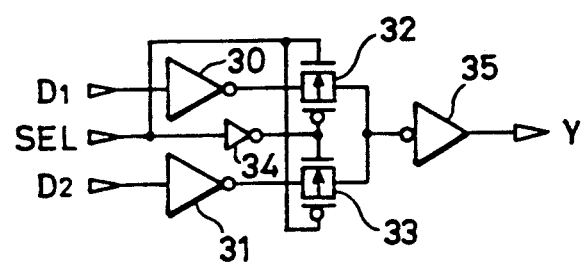
Figure 8:
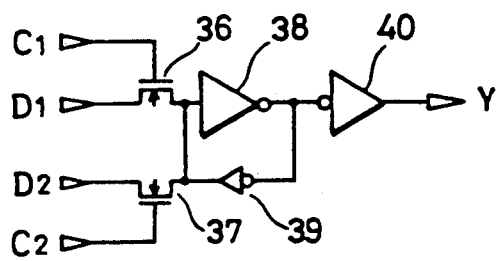
Figure 9:
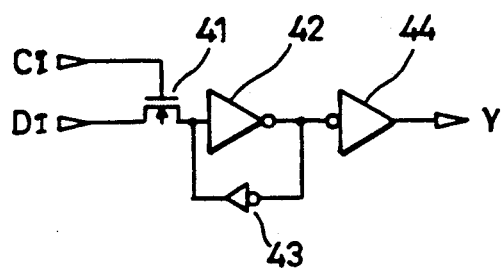
Figure 10:
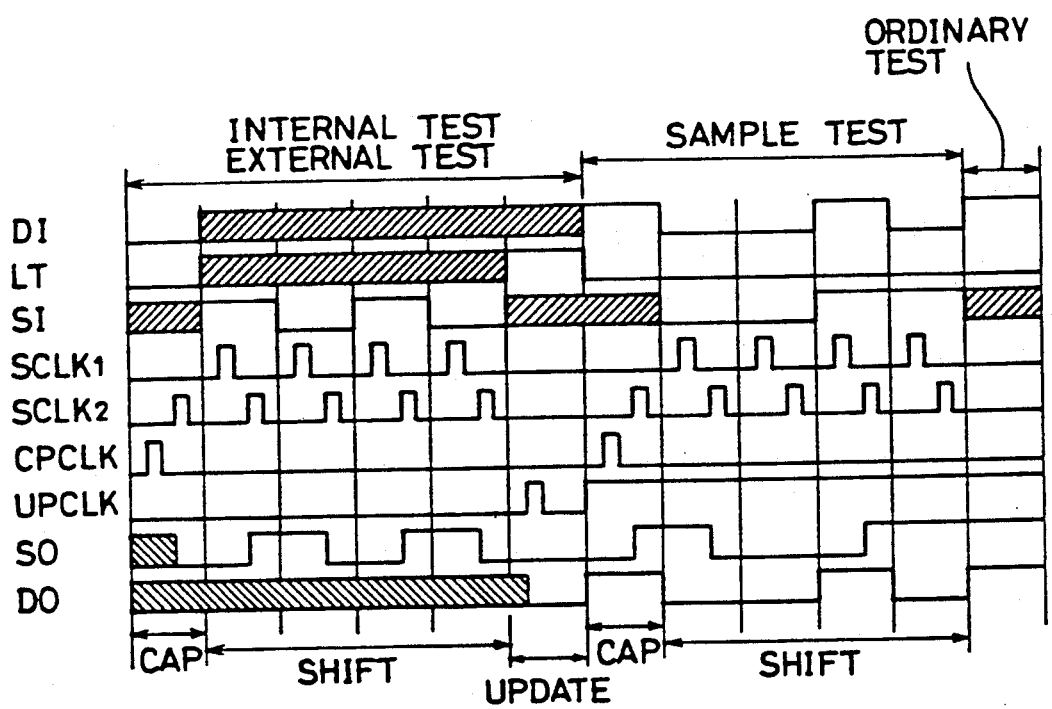
Figure 11:
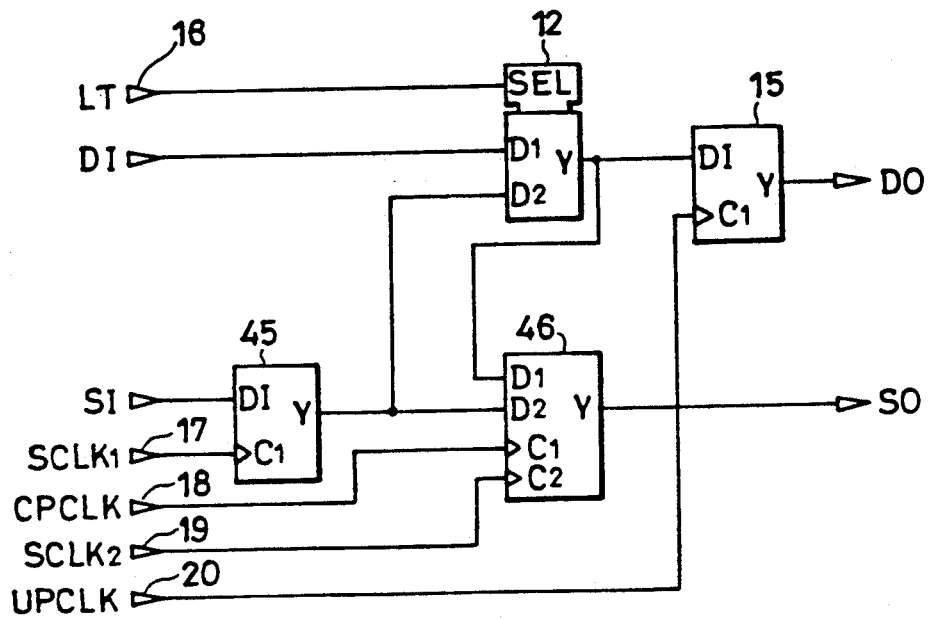
Figure 12:
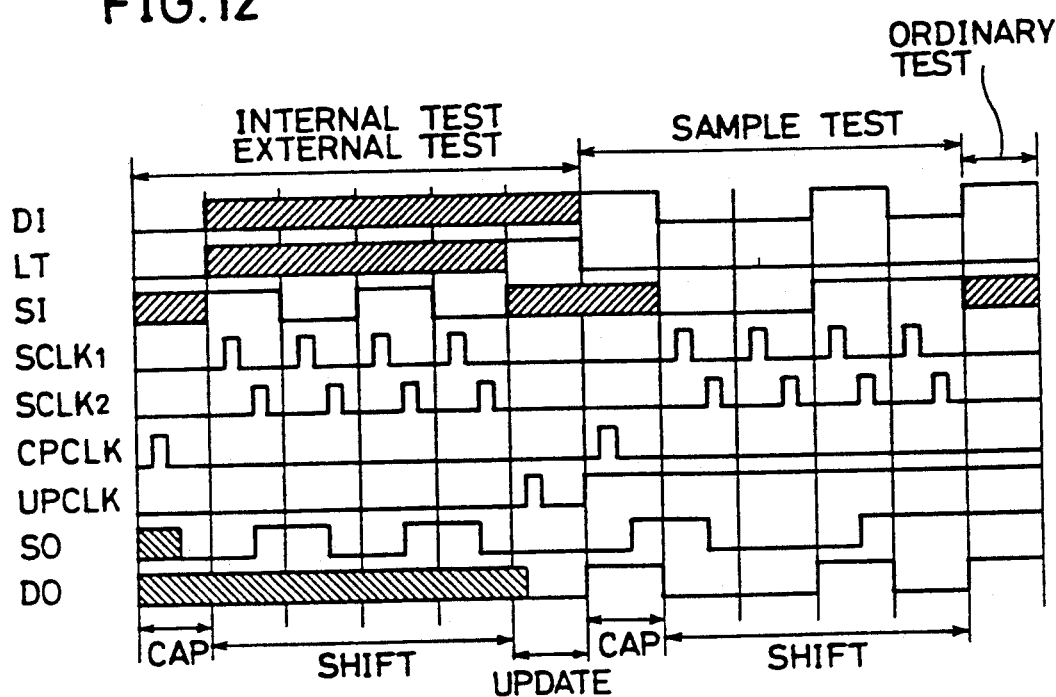
Figure 13:
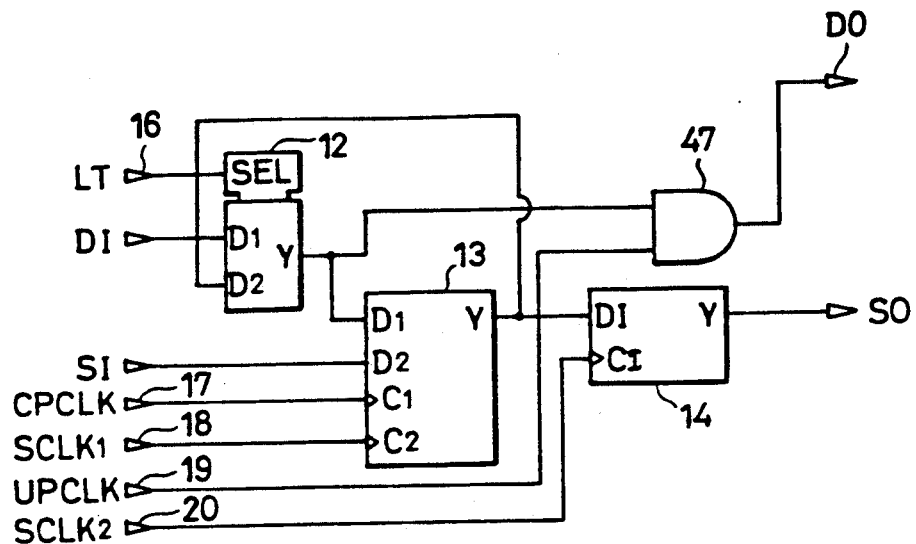
Figure 14:
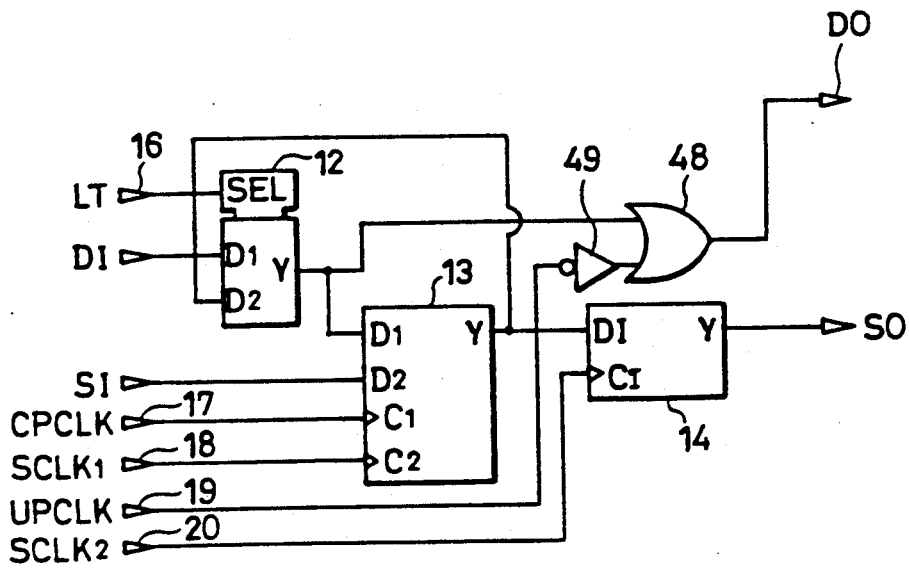
Figure 15:
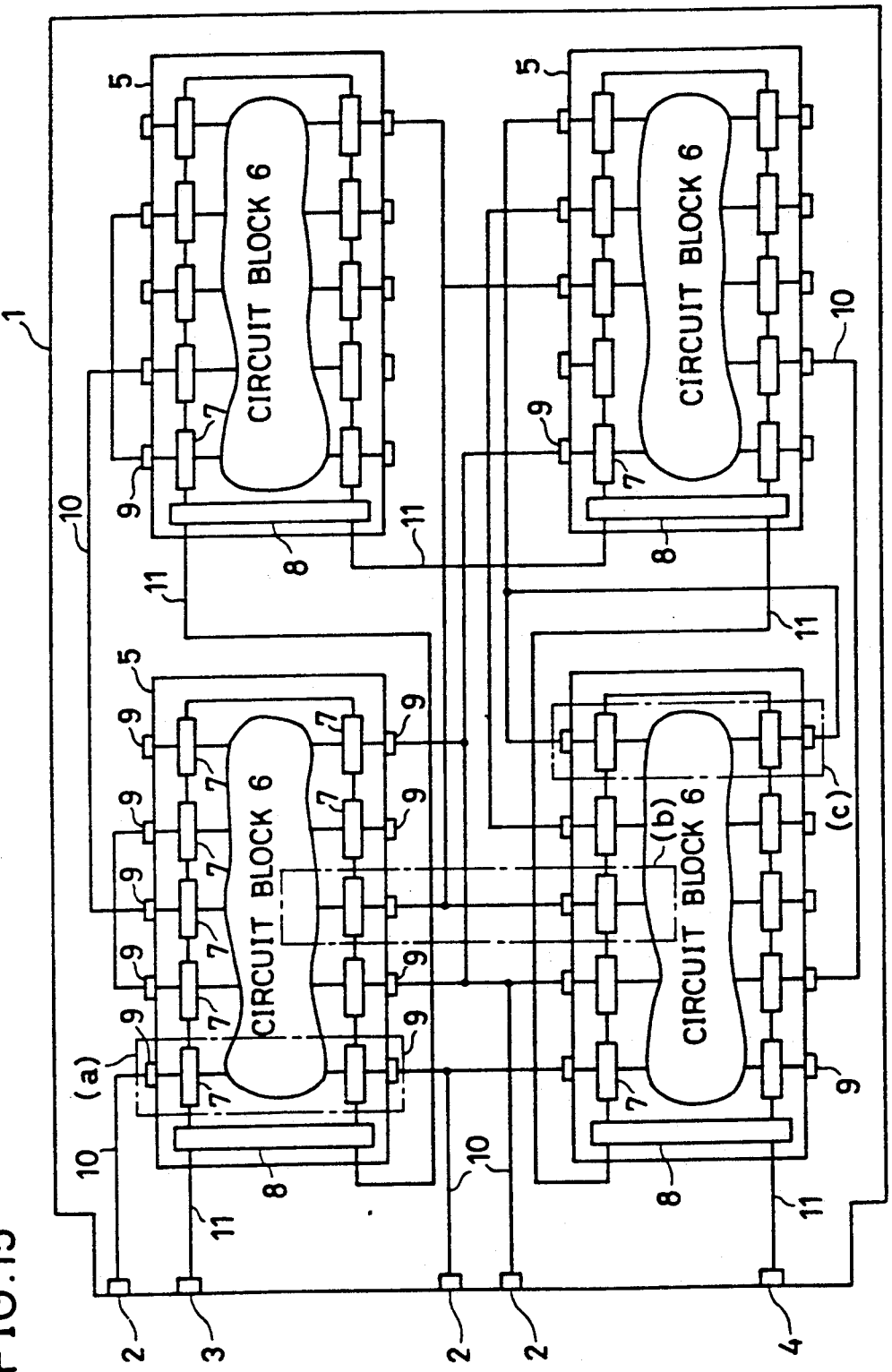
Figure 16:
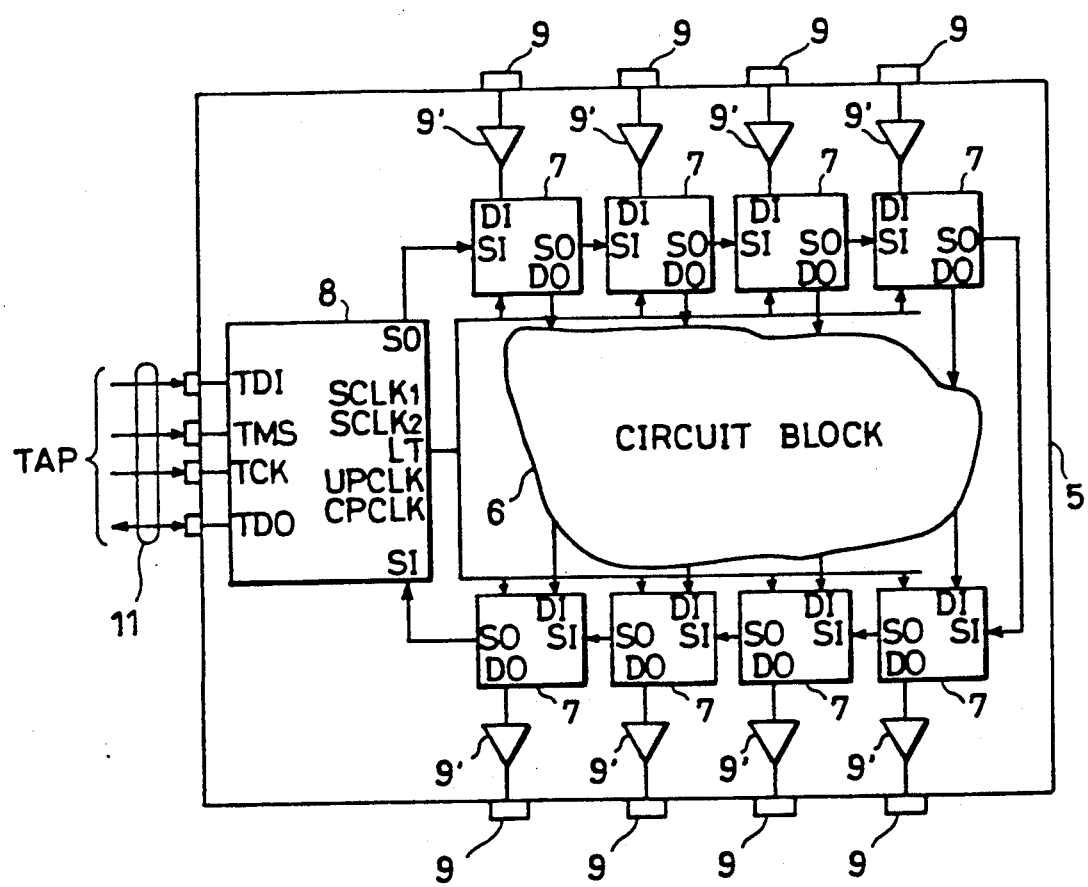
Figure 17A:
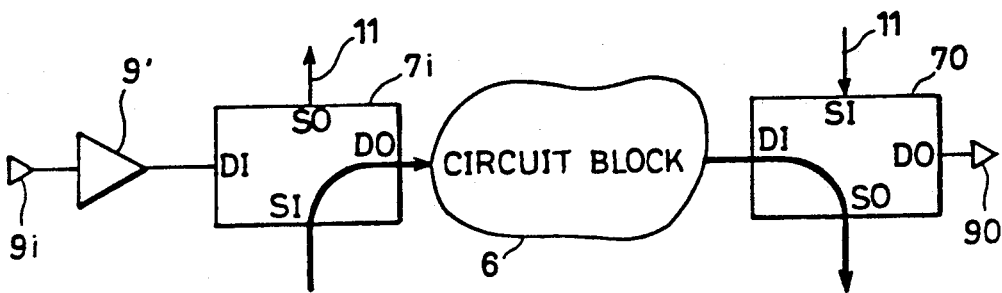
Figure 17B:
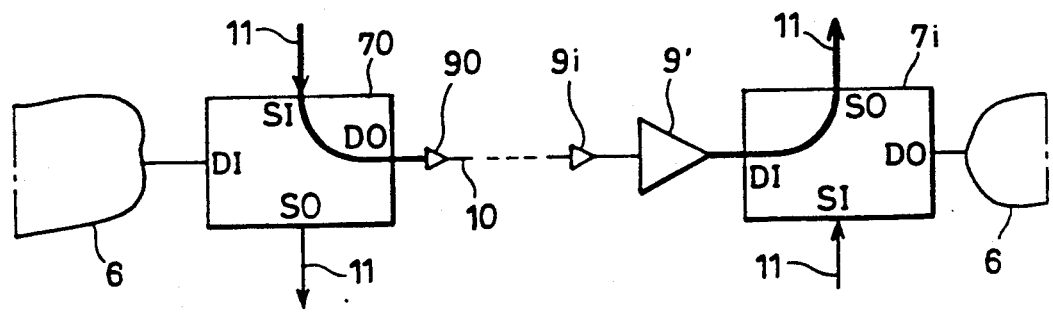
Figure 17C:
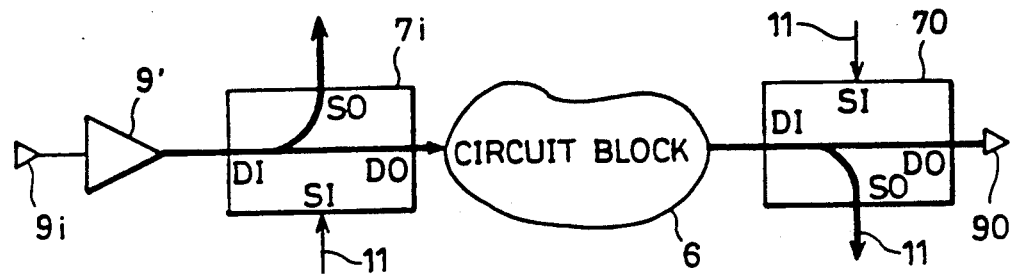
Figure 18A:
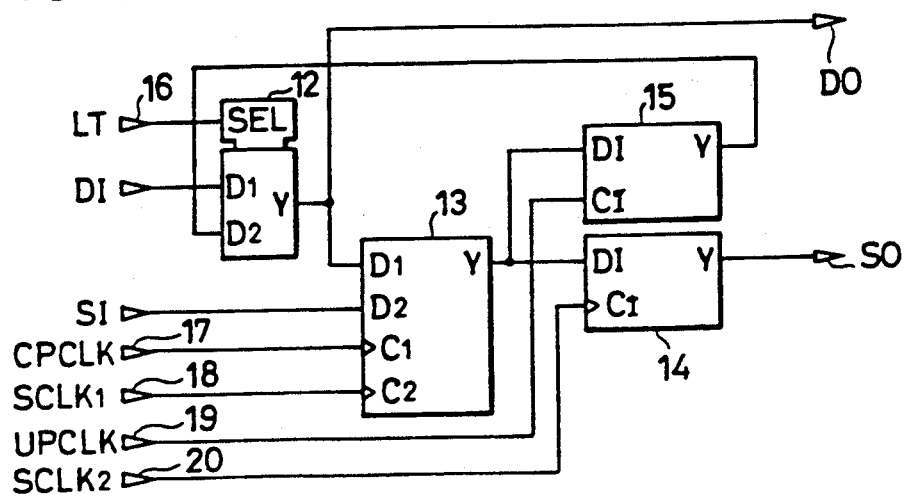
Figure 18B:
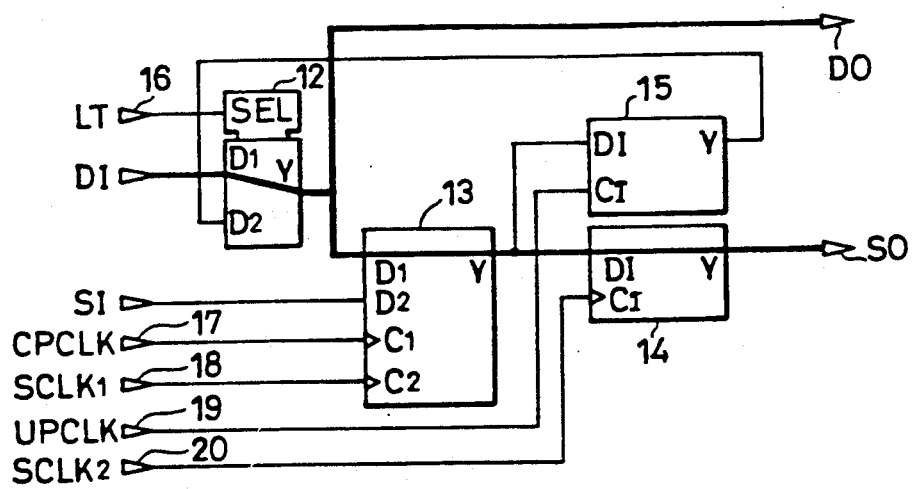
Figure 18C:
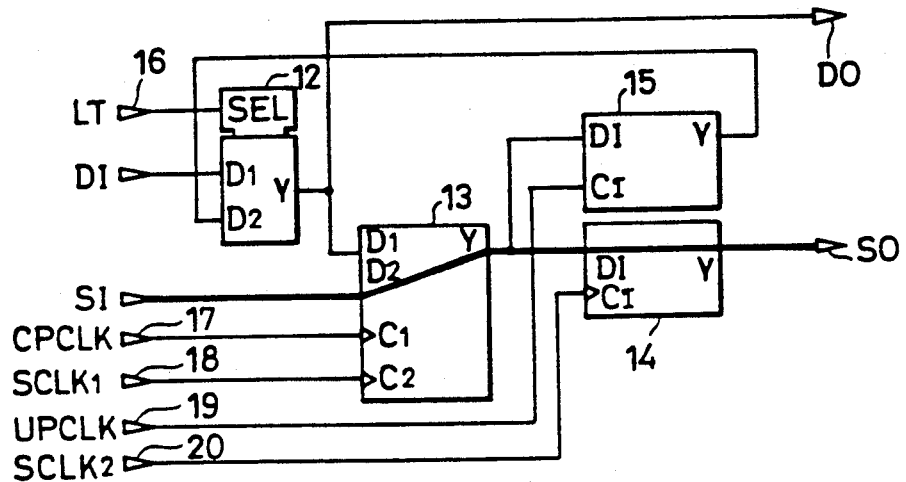
Figure 18D:
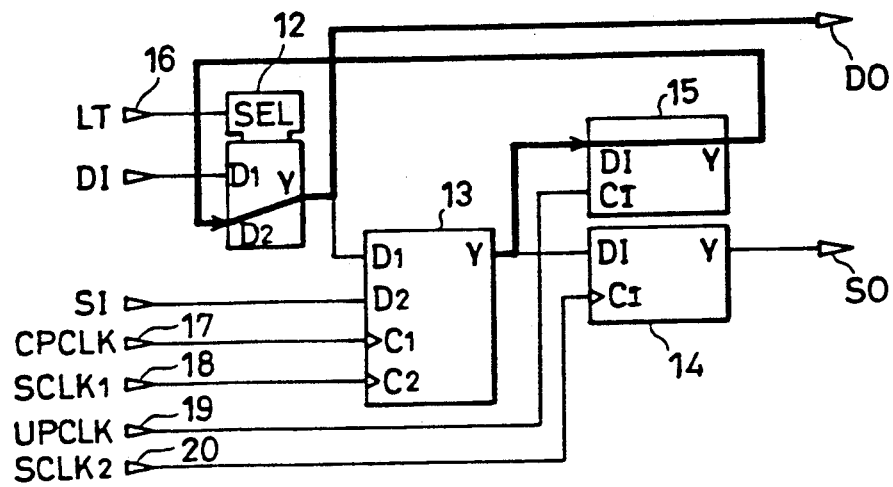
Figure 20A:
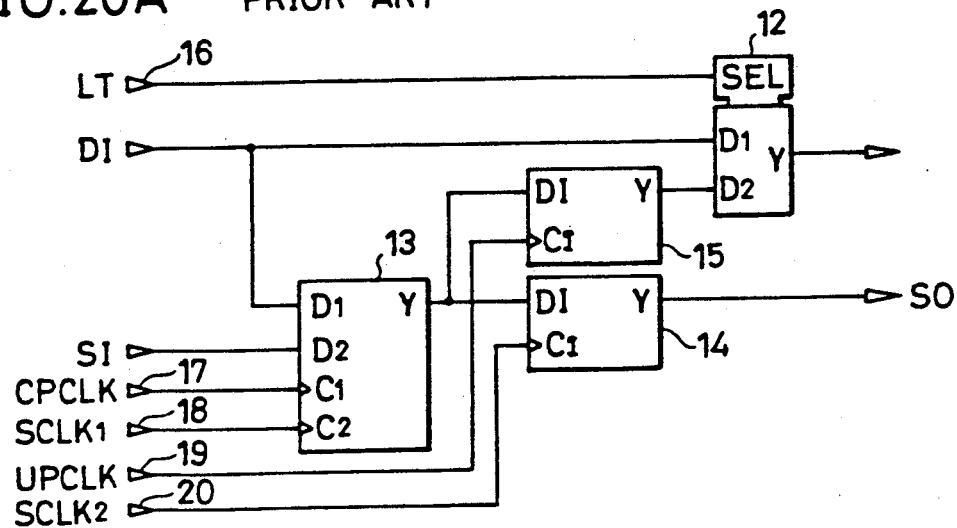
Figure 20B:
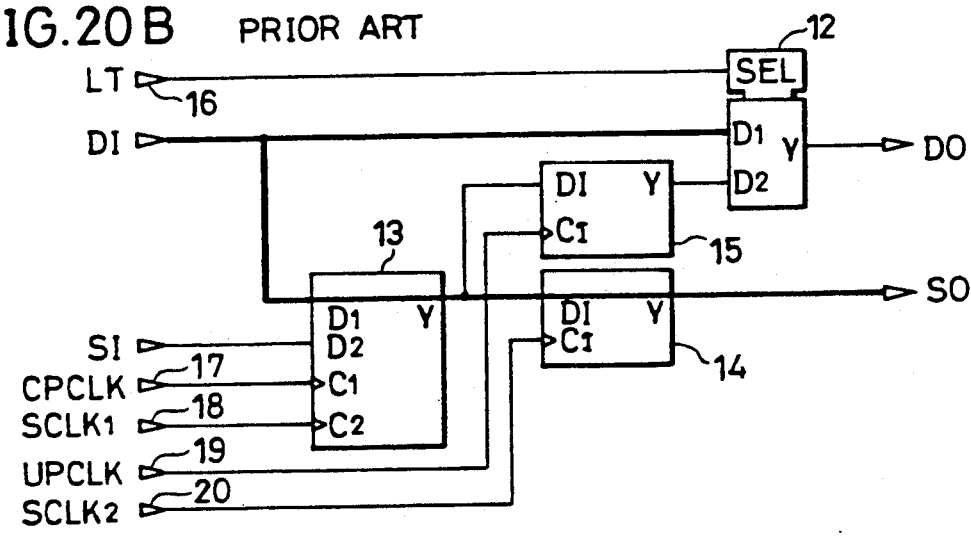
Figure 20C:
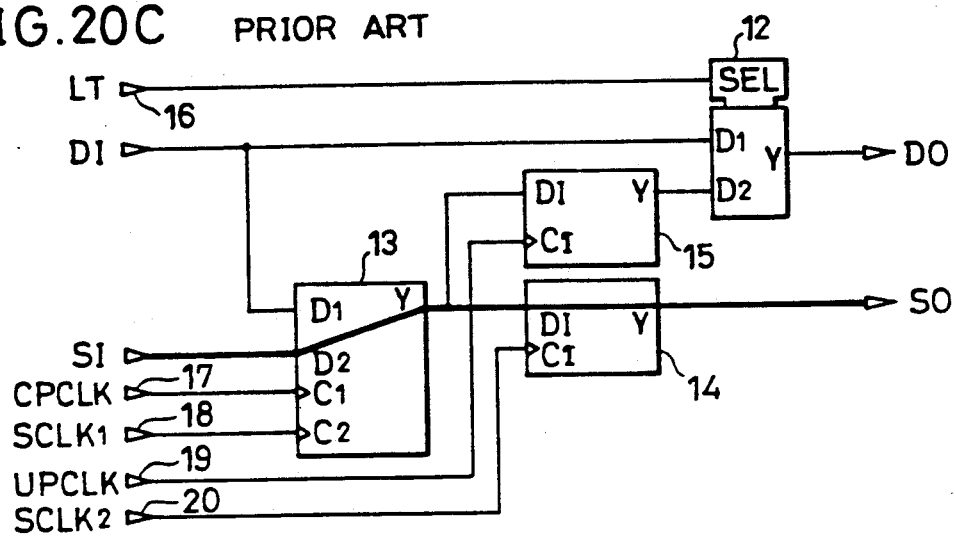
Figure 20D:
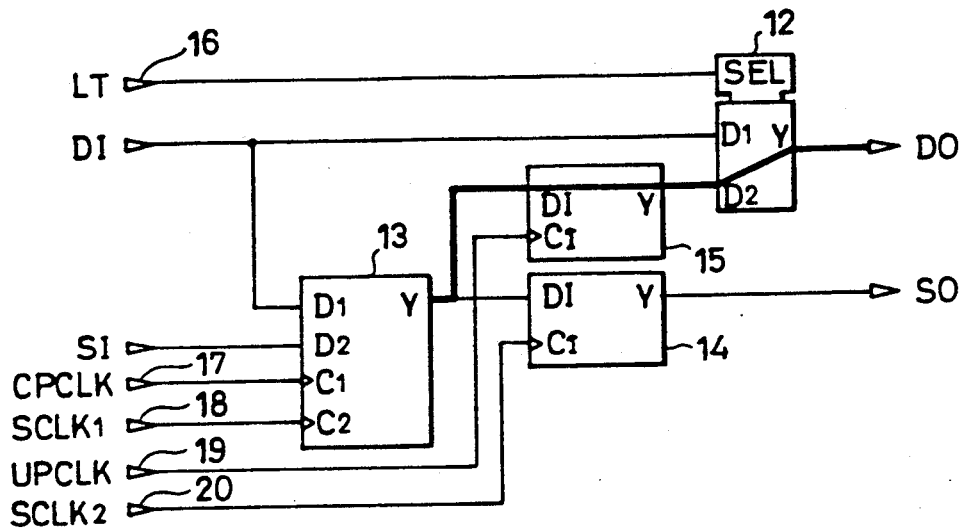

FIGS. 3(a)-(l) are circuit diagrams showing details of the access port controllers;

FIG. 4 is a circuit diagram of an instruction register;

FIG. 5 is a circuit diagram of a bypass register;

FIG. 6 is a circuit diagram showing details of a boundary scan/register according to the invention;

FIGS. 6B, 6C and 6D are diagrams showing test data paths of FIG. 6A;

FIG. 7 is a circuit diagram showing details of a selector circuit;

FIG. 8 is a circuit diagram showing details of a latch circuit having two inputs;

FIG. 9 is a circuit diagram showing details of a latch circuit having one input;

FIG. 10 is a timing chart of the boundary scan register shown in FIG. 6;

FIG. 11 is a circuit diagram showing another embodiment;

FIG. 12 is a timing chart of the embodiment of FIG. 11;

FIGS. 13 and 14 are circuit diagrams showing still another embodiment;

FIG. 15 is a diagram showing a board experimentally designed by a boundary scan design;

FIG. 16 is a block diagram showing details of a chip;

FIGS. 17A, 17B and 17C are block diagrams showing three types of tests by a boundary scan register;

FIGS. 18A and 20A are block diagrams of conventional boundary scan registers;

FIGS. 18B, 18C and 18D are diagrams showing test data paths of FIG. 18A;

FIGS. 20B, 20C and 20D are diagrams showing test data paths of FIG. 20A; and

Figure 19:
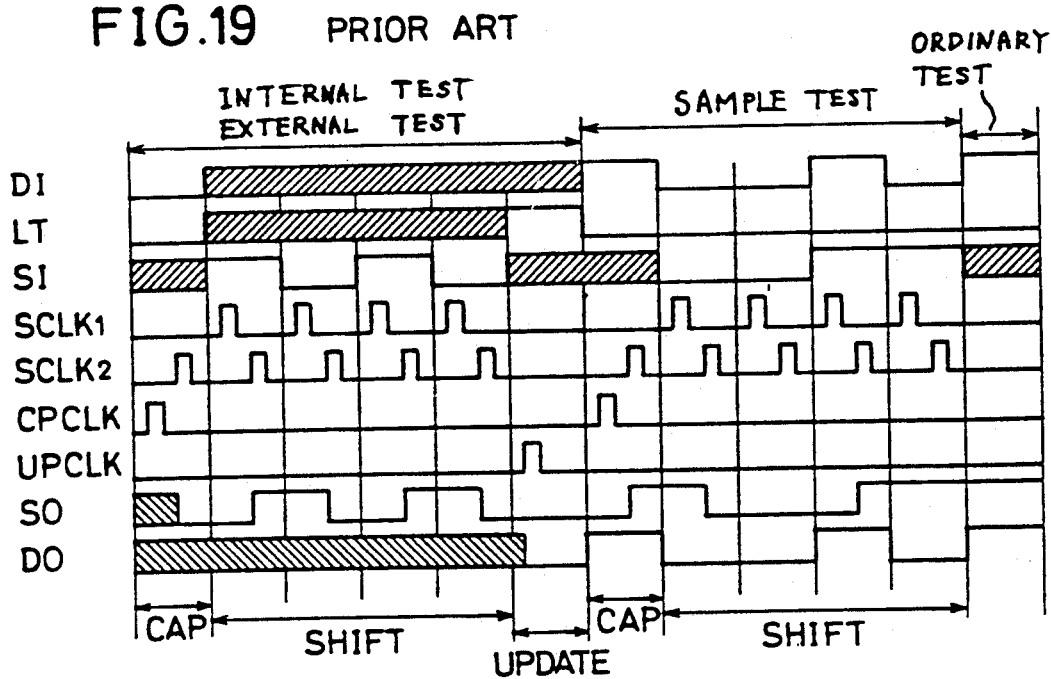
Figure 21:
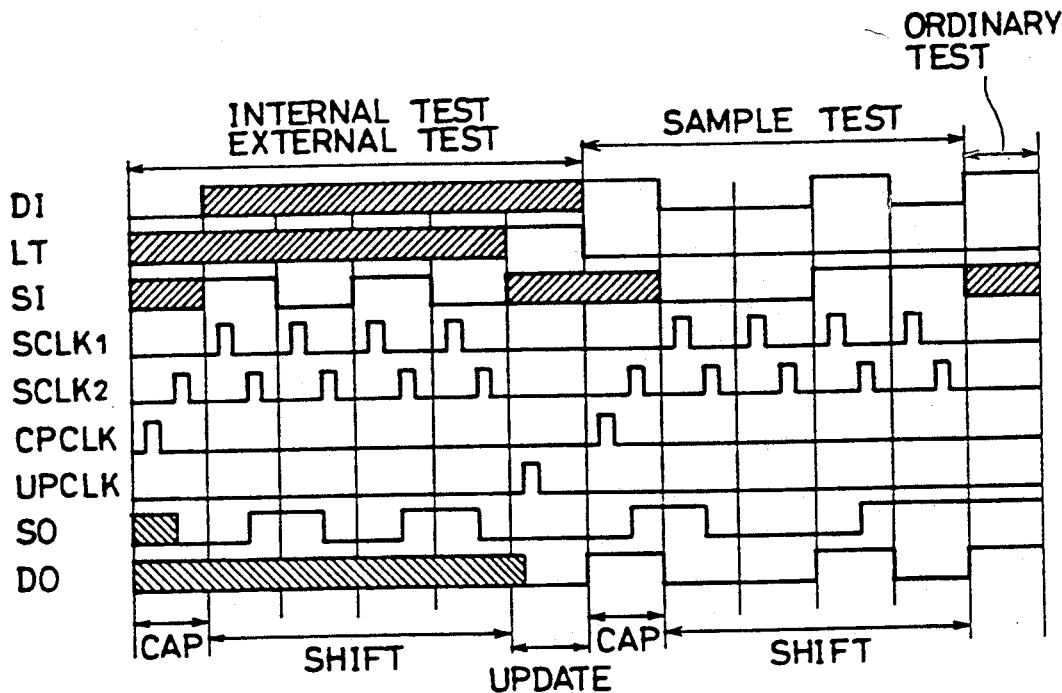

FIGS. 19 and 21 are timing charts of boundary scan registers in FIGS. 18A and 20A, respectively.

DESCRIPTION OF THE PREFERRED EMBODIMENTS

A test circuit device according to the invention will be described in detail hereinafter with reference to the accompanying drawings. The test circuit device according to the invention differs from those of the conventional art in boundary scan registers and a control circuit 8, and they are the same with respect to the others.

Figure 1:
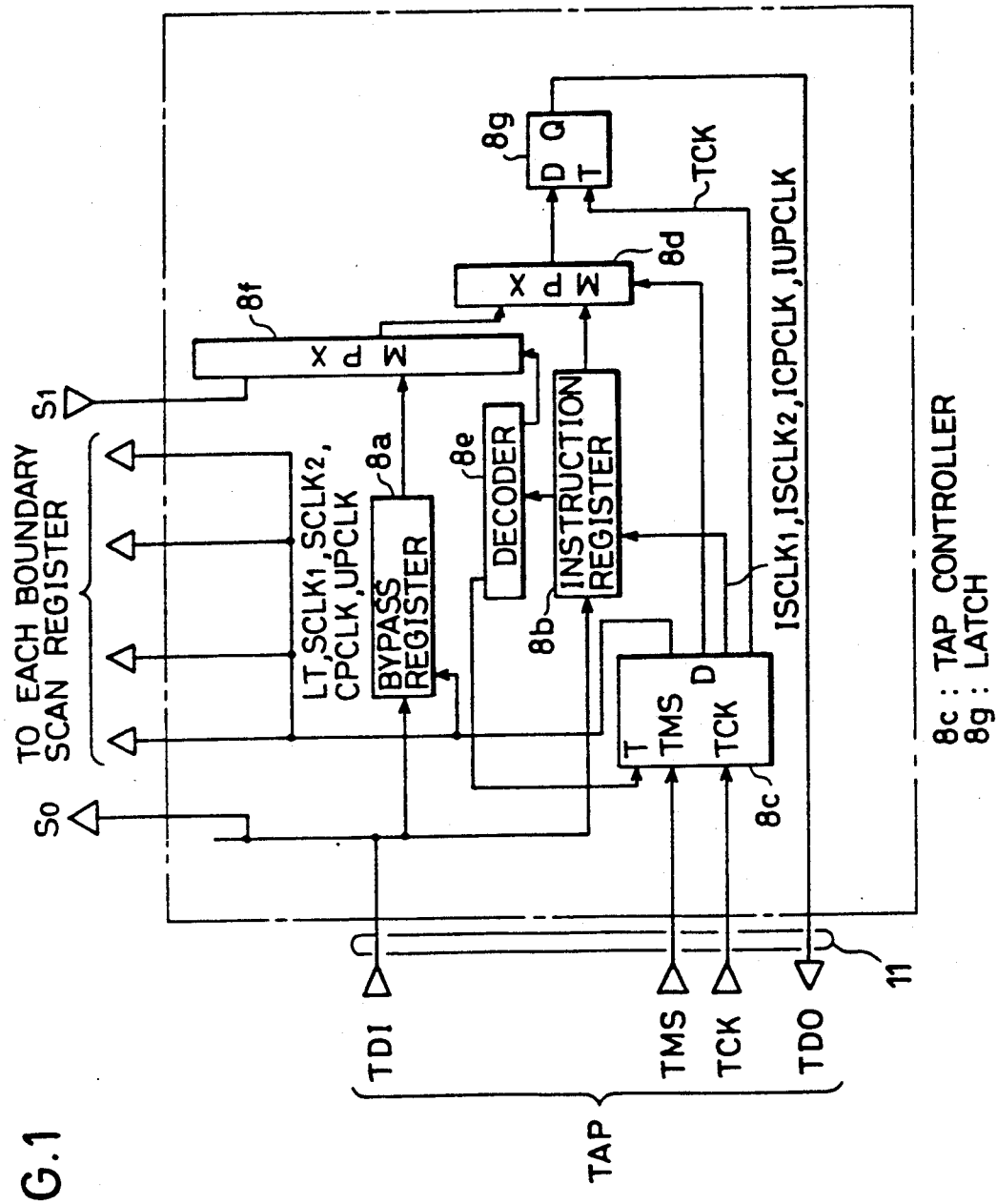
FIG. 1 is a block diagram of a control circuit according to the invention.

FIG. 1 is a block diagram showing details of the control circuit 8 in the test circuit device according to the invention. Referring to FIG. 1, the control circuit 8 receives through test access ports TAP test data TDI, a test mode select signal TMS and a test clock TCK. The test data TDI is applied to a scan output terminal SO, a bypass register 8a and an instruction register 8b. The test mode select signal TMS and the test clock TCK are applied to a test access port controller 8c (which will be called as "TAP controller" hereinafter). The TAP controller 8c generates signals LT, SCLK1, SCLK2, CPCLK and UPCLK for controlling boundary scan registers 7, and also generates signals ISCLK1 and ISCLK2, a capture clock ICPCLK and a data output clock IUPCLK which are readable by the instruction register 8. Thus, the TAP controller 8c is a state-transition machine, by which the same state as the sequence defined by said reference "IEEE p.1149.1/D5" is formed by the test mode select signal TMS and the test clock TCK (see FIG. 2). The instruction register 8b responds to the clocks ISCLK1, ISCLK2, ICPCLK and IUPCLK to apply the test data TDI to a multiplexer 8d and a decoder 8e. The decoder 8e decodes data (instruction) from the instruction register 8b, and applies a signal at a high level to an input terminal T of the above TAP controller when it determines as an internal test or an external test. The decoder 8e further responds to the instruction from the instruction register 8b to control a multiplexer 8f. The TAP controller 8c responds to the signal at the high level applied to the input terminal T from the decoder 8e to generate a signal for controlling each boundary scan register 7. Said multiplexer 8f receives test data from the bypass register 8a and data input to a scan input terminal SI through a shift pass. The multiplexer 8f responds to the control signal from the decoder 8e to select either one of the signals and apply the selected data to the multiplexer 8d. The multiplexer 8d responds to the control signal from the TAP controller 8c to select either one the data from the multiplexer 8f or the data from the instruction register 8b and apply the selector signal to a latch 8g. The latch 8g responds to the test clock TCK from the TAP controller 8c to apply the data from the multiplexer 8d to a test output terminal TDO.

Figure 2:
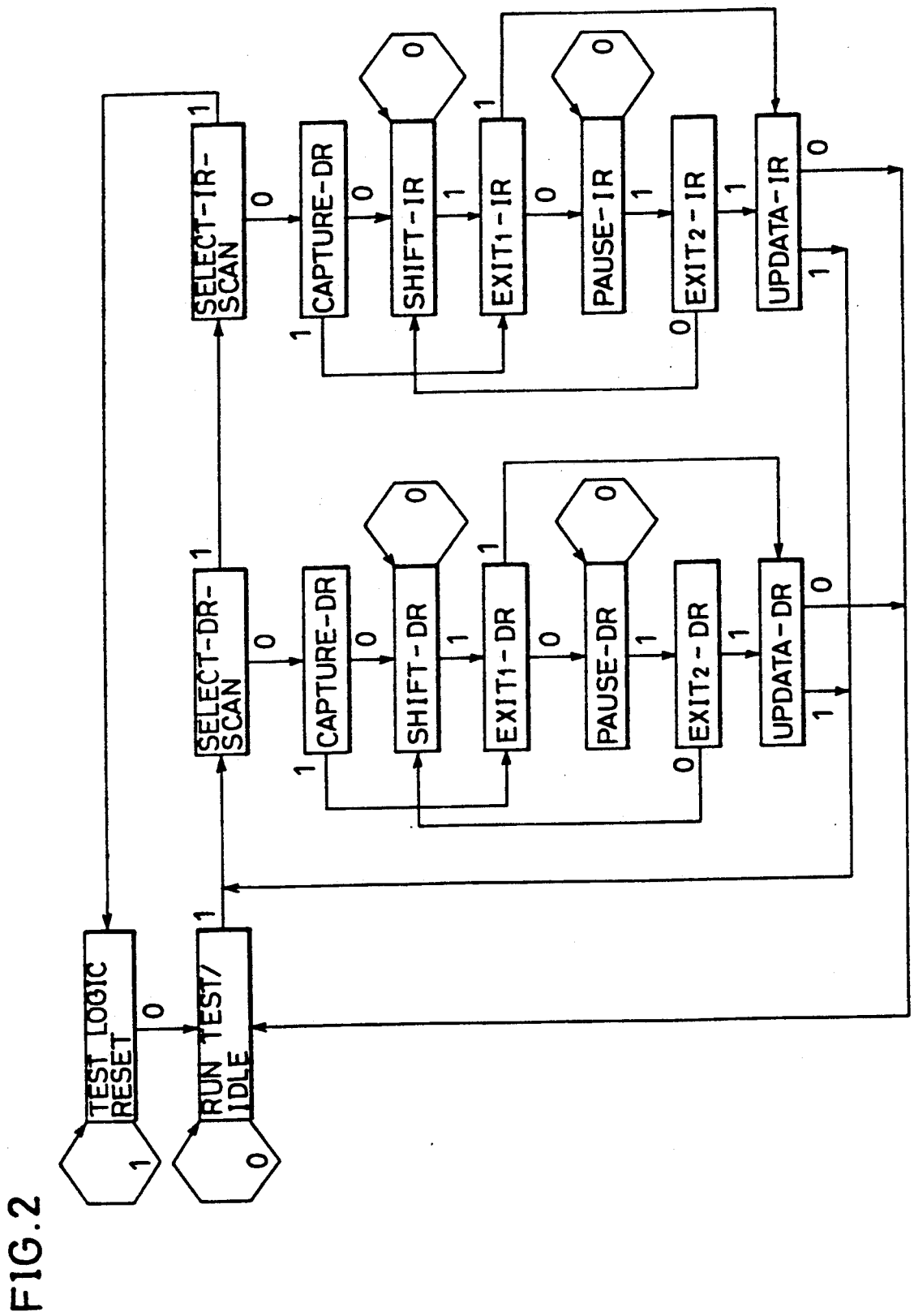
FIG. 2 is a diagram showing a sequence of a control circuit in FIG. 1.
Figure 3B:
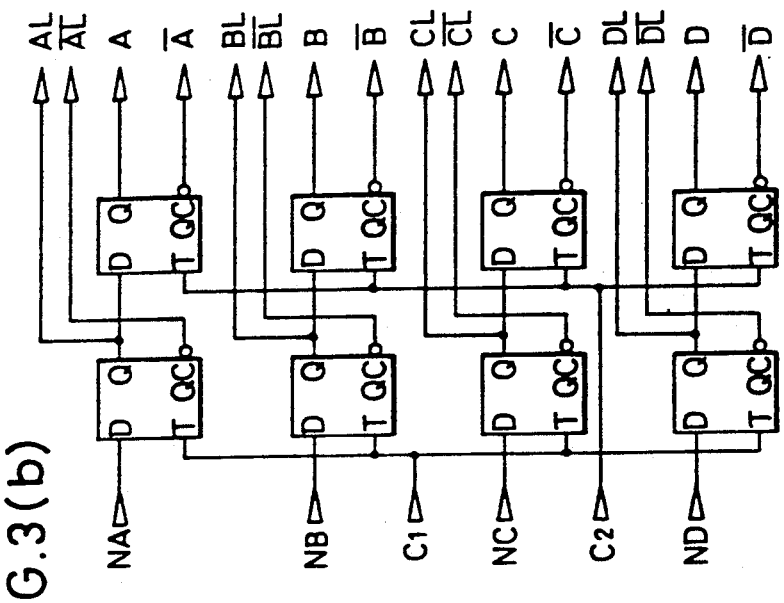
Figure 3C:
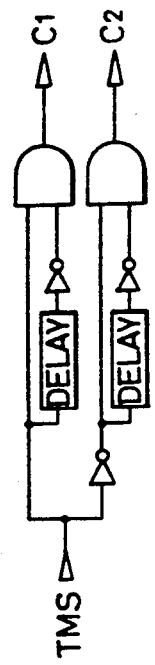
Figure 3A:
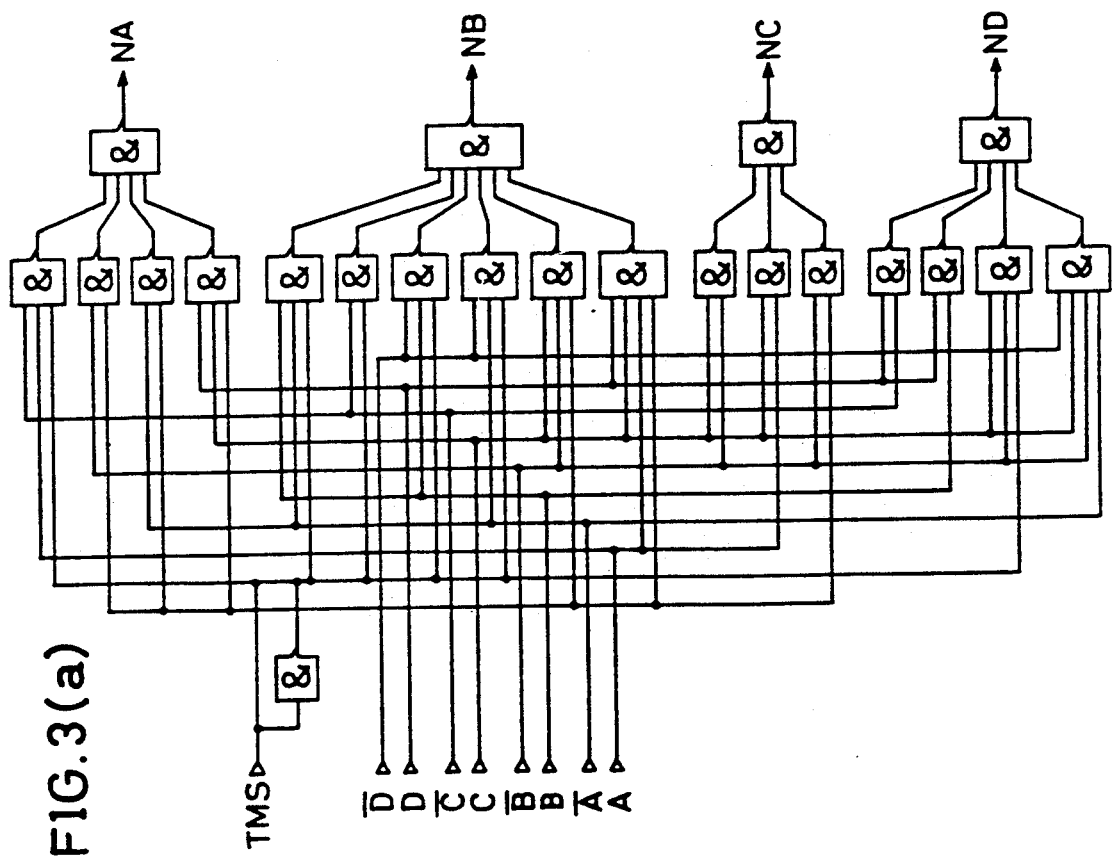
Figure 3D:
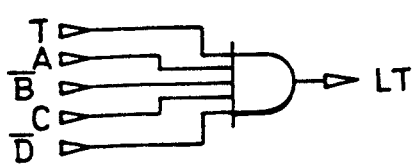
Figure 3E:
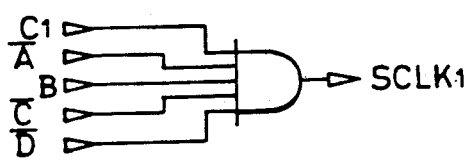
Figure 3F:
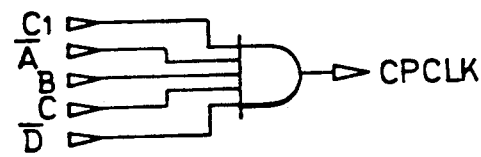
Figure 3G:
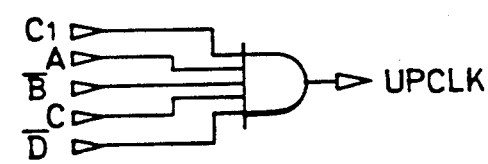
Figure 3H:
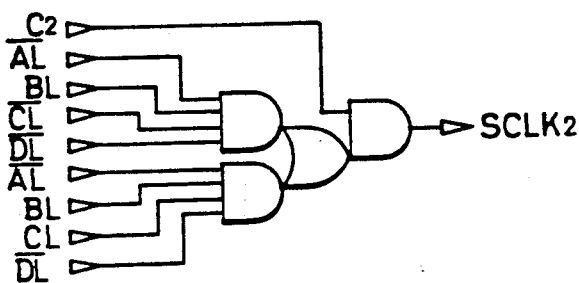
Figure 3I:
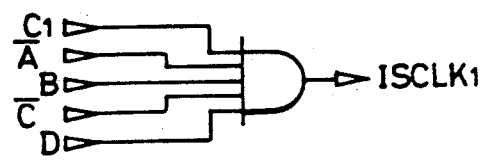
Figure 3J:
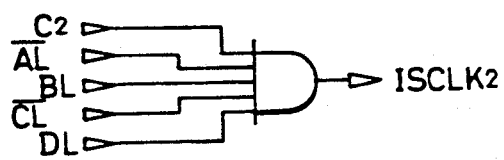
Figure 3K:
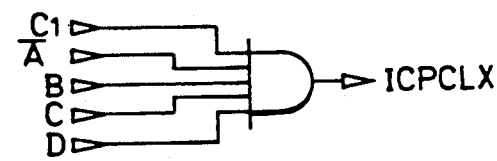
Figure 3K:
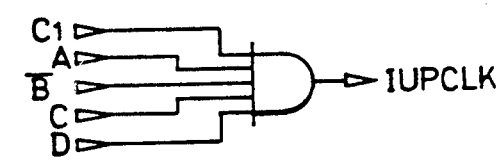

FIG. 2 shows a sequence of the control circuit in the above FIG. 1. This sequence is the same as that described in said "IEEE" p.1149.1. This sequence shows the following states:

Test-Logic-Reset

A state in which a test logic is disabled, and a normal operation of a system logic is enabled.

Run-Test Idle

A basic state during execution of the test. A particular instruction can be executed at an intermediate state during a scan operation.

Select-DR-Scan

A scan sequence of the test data registers (boundary scan registers and a bypass register) are initialized.

Select-IR-Scan

A scan sequence of the instruction register is initialized.

Capture-DR

A basic state for capturing a response. Data is loaded in parallel in the test data register selected by an instruction of an execution length.

Shift-DR

The test data registers are connected in a shift state between the shift data input port TDI and the test data output port TDO, and the data is shifted one by one toward the data output port TDO every time when the shift clock TCK is raised.

Exit1-DR

The scan is terminated.

Pause-DR

The shift operation of the test data register at the serial pass between the test data input port TDI and the test data output port TDO is paused.

Ext2-DR

The scan is terminated.

Update-DR

The data is latched to the parallel outputs of the test register group from the shift register pass.

Capture-IR

A fixed pattern is captured in the instruction register.

Shift-IR

The instruction register is connected between the test data input port TDI and the test data output port TDO, and the data is shifted toward the test data output port TDO every time when the test clock TCK is raised.

Exit1-IR

The scan is terminated.

Pause-IR

The shift operation of the instruction register at the serial pass between the test data input port TDI and the test data output port TDO is paused.

Exit2-IR

The scan is terminated.

Update-IR

A new instruction is loaded in the instruction register. The instruction shifted in the instruction register is latched, and is output in parallel. After the completion of the latching, the execution of the instruction starts.

Said TAP controller 8c is illustrated in detail in FIGS. 3 (a)-(l). Referring to these figures, a circuit in FIG. 3(a) and a circuit in FIG. 3(b) form a loop, and an output in FIG. 3(b) is applied to circuits in FIGS. 3(d)-(l). Signals C1 and C2 applied to the circuit in FIG. 3(b) are formed by inverters, delay circuits and gates. More specifically, a plurality of gate circuit shown in FIG. 3(a) receive the test mode select signal TMS a well as output signals $\overline{A}$, A, $\overline{B}$, B, $\overline{C}$, C, $\overline{D}$, D from a plurality of latch circuits shown in FIG. 3(b). These signals are combined together by a plurality of AND gates to obtain predetermined output signals NA, NB, NC and ND. The circuit shown in FIG. 3(b) receives the signals NA, NB, NC and ND input from the circuit shown in FIG. 3 and the signals C1 and C2 formed by the circuit shown in FIG. 3(c). The latch circuits form signals including AL, $\overline{AL}$, A, $\overline{A}$, BL, $\overline{BL}$, B, $\overline{B}$, CL, $\overline{CL}$, C, $\overline{C}$, DL, $\overline{DL}$, D, $\overline{D}$ in response to these signals. The circuit in FIG. 3(d) is a circuit for generating a signal which attains a high level at the internal test and the external test applied from the decoder 8e. In response to the input signals T, A, $\overline{B}$, C, and $\overline{D}$, it generates the signal LT for controlling the selector circuit 12. The circuits described below and shown in FIGS. 3(e)-(l) generate the select signal LT, clock signals SCLK1, CPCLK, UPCLK, SCLK2, ISCLK1, ISCLK2, ICPLCK2, ICPCLK and IUPCLK to be applied to the boundary register 7 and the instruction register 8b.

FIG. 4 is a circuit diagram showing details of said instruction register. Referring to FIG. 4, the instruction register 8b includes a latch circuit 8L1 having two inputs, a latch circuit 8L2 having one input and a latch circuit 8L3 having one input. Operations of these circuits are as follows. A state-maintaining code is applied from the system to the data input D1 of the latch circuit 8L1, which applies the state-maintaining code to the latch circuit 8L3 in response to the capture clock ICPCLK1. Then, the data output clock IUPCLK is applied to the terminal T of the latch circuit 8L3. Accordingly, the state-maintaining code from the system is output through the output terminal Do to the multiplexer 8f. The test data TDI is applied to the data input D2 of the latch circuit 8L1. In response to the incoming of the shift clocks ISCLK1 and ISCLK2, the test data TDI is shifted from the latch circuit 8L1 to the latch circuit 8L2, and the shifted test data TDI is output through the scan output terminal SO to the decoder 8l, and is further output therefrom to the multiplexer 8f.

FIG. 5 is a circuit diagram showing details of said bypass register. Referring to FIG. 5, the bypass register 8a includes a latch circuit 8L4 and a latch circuit 8L5. The latch circuit 8L4 receives at a data input D the test data TDI. The latch circuit 8L4 responds to the shift clock SCLK1 applied from the TAP controller 8c to apply the received test data TDI to the latch circuit 8L5. The latch circuit 8L5 responds to the shift clock SCLK2 input to a clock terminal T to output the data latched therein from a scan output terminal SO. The output data is applied to the multiplexer 8f.

FIG. 6A is a block diagram of the boundary scan register. Referring to FIG. 6A, this boundary scan register includes, like the boundary scan register shown in FIG. 18A, a selector circuit 12, a 2-input latch circuit 13, a latch circuit 14 and a latch circuit 15. The connections between the respective circuits are different as follows:

(1) a data input D2 of the selector circuit 12 is not connected to an output terminal Y of the latch circuit 15 but to an output terminal Y of the 2-input latch circuit 13.

(2) an output terminal Y of the selector circuit 12 is not connected to a test data output terminal DO but to a data input DI of the latch circuit 15 and a data input D1 of the 2-input latch circuit 13.

(3) the output terminal Y of the latch circuit 15 is not connected to the data input D2 of the selector circuit 12 but to the data output terminal DO.

In such connections, each of the circuits of FIG. 6A handles data in the following manner. The selector circuit 12 responds to a control signal LT to select either data from the data input terminal DI (data from the system data terminal 9 or data from the circuit block 6) or test data from the 2-input latch circuit 13 and then apply the selected data to the 2-input latch circuit 13 and the latch circuit 15. The 2-input latch circuit 13 responds to the clock CPCLK to latch data transmitted from the selector circuit 12 to apply the latched data to the latch circuit 14 and the data input D2 of the selector circuit 12. The 2-input latch circuit 13 responds to the clock SCLK1 to latch test data transmitted from a scan-in terminal SI to apply the latched data to the latch circuit 14 and the data input D2 of the selector circuit 12. The latch circuit 14 responds to the clock SCLK2 to latch data transmitted from the 2-input latch circuit 13 to apply the latched data to a scan-output terminal SO. The latch circuit 15 responds to the clock UPCLK to apply test data transmitted from the selector circuit 12 to the data output terminal DO.

FIGS. 6B, 6C and 6D are diagrams showing data paths in a capture operation, shift operation and update operation of the boundary scan register of FIG. 6A, respectively.

Referring to FIG. 6B, in the capture operation, the selector circuit 12 responds to a control signal LT at the low level to select a data input D1; the 2-input latch circuit 13 responds to the clock CPCLK to latch the data to be applied to the data input Dl; and the latch circuit 14 responds to the clock SCLK2 to latch data. A path for capture is established from the data input terminal DI to the scan output terminal SO.

Referring to FIG. 6C, in the shift operation, the 2-input latch circuit 13 responds to the clock SCLK1 to latch test data to be applied to the data input D2, and the latch circuit 14 responds to the clock SCLK2 to latch data to be applied to the data input DI. A path for shifting is thus established from the scan input terminal SI to the scan output terminal SO.

Referring to FIG. 6D, in the update operation, the selector circuit 12 responds to a control signal LT at the high level to select the data input D2, and the latch circuit 15 responds to the clock UPCLK to latch test data to be applied to the data input DI. A path for data output is thus established from the output Y of the latch circuit 13 to the data output terminal DO. The data latched in the latch circuit 13 is applied to the circuit block 6 or the system data terminal 9 through this data output path by the shift operation.

As has been described heretofore, in this boundary scan latch, since the circuit 15 is connected between the output Y of the selector circuit 12 and the data output terminal DO, no data is directly applied to the output buffers 9' in the capture operation. Accordingly, no error is produced in data due to simultaneous changes of the plurality of output buffers 9'.

Moreover, since the data captured by the 2-input latch circuit 13 is transmitted through the path established from the data input terminal DO to the output terminal Y of the selector circuit 12, this path can be checked on the basis of the captured data. This makes it possible to check all the data transmission paths as well as a test path.

FIG. 7 is a circuit diagram showing details of the selector circuit 12 shown in FIG. 6. Referring to FIG. 7, the signals input to the data input terminal D1 and D2 are inverted by inverters 30 and 31 and then applied to transfer gates 32 and 33, respectively. The signals applied to these transfer gates are selected by the control signals LT which are applied to a selector terminal SEL, and are inverted and not inverted. The selected signal is output after inversion by an inverter 35. Therefore, if the signal at the high level is applied to the clock input terminal C1 of the latch circuit 15 in the normal operation, then the latch circuit 15 can serve as a mere noninversion driver (buffer) from the input terminal DI to the output terminal Y.

FIG. 8 is a circuit diagram showing details of said latch circuit 13 having two inputs. Referring to FIG. 8, an n-channel MOSFET 36 responds to the clock signal from the clock input terminal C1 to become conductive and apply the data input from the data input terminal D1 to a flip-flop composed of an inverter 38 and an inverter 39. To the input side of this flipflop, an n-channel MOSFET 37 is connected as well as the n-channel MOSFET 36. The MOSFET 37 responds to the clock signal applied to the clock input terminal C2 to become conductive and apply the data input from the data input terminal D2 to the flip-flop. To the output side of the flip-flop is connected an inverter 40, which outputs the input data without inverting the same. Thus, the latching of the data is executed by applying the clock signal to the terminal C1 or C2 and controlling the n-channel transfer gates 36 and 37. Therefore, in the latch circuit having two inputs, the control signals SCLK1 and SCLK2, which are not overlapped with each other, can be applied to the terminals C1 and C2 to suppress contention of the data, respectively.

FIG. 9 is a circuit diagram showing details of each of the latch circuits 14 and 15. Referring to FIG. 9, the illustrated circuit is of a ratio type having one input, i.e., the clock signal input terminal C1, for receiving a signal, by which the data input in the data input terminal D1 is applied through an n-channel MOSFET 41 to a flip-flop composed of inverters 42 and 43. Accordingly, the input data is held. Thus, the latching of the data is executed by applying the clock signal to the clock input terminal C1 and controlling the n-channel MOSFET 41.

Three types of the test functions, i.e., CAPTURE, SHIFT, UPDATE, at the internal test, external test and sample test in the test circuit device having said structures will be described below. In the description of these operations, reference is made to a timing chart in FIG. 10, wherein hatched portions indicate arbitrary condition.

[I] Internal Test (1) CAPTURE

The selector circuit 12 responds to the control signal LT (low level) from the control circuit 8 to select the data input DI. The signal input through the data input terminal DI is applied from the output terminal Y of the selector circuit to the latch circuit 15 and the latch circuit 13. At this time, since the data output clock UPCLK is not applied to the clock input terminal C1 of the latch circuit 15, the output state at the data output terminal DO remains unchanged as previous state. Then, by applying the capture clock CPCLK from the control circuit 8 to the clock input terminal C1 of the latch circuit 13, the data at the input terminal D1 of the latch circuit 13 (i.e., the output terminal of the selector circuit 12 connected thereto) is captured. Then, by applying the shift clock SCLK2 to the clock input terminal C1 of the latch circuit 14, the data latched in the latch circuit 13 is transmitted to the latch circuit 14.

(2) SHIFT

The control circuit 8 applies the non-overlapped clocks SCLK1 and SCLK2 of two phases to the clock input terminal C1 of the latch circuit 13 and the clock input terminal C1 of the latch circuit 14 to carry out the shift operation from the scan input terminal SI to the scan output terminal SO. In this operation, the data captured in the latch circuit 13 in CAPTURE is shifted-out, and external serial data of the chip 5 is shifted-in and held in the latch circuit 13.

(3) DATA OUTPUT

The data, which was shifted-in from the scan input terminal SI by the non-overlapped clocks SCLK1 and SCLK2 of two phases in the shift operation, is held in the latch circuit 13 and the latch circuit 14. For outputting the held data from the data output terminal DO, the control circuit 8 set the control signal LT at the high leve'. In response to this, the selector circuit 12 selects the data input D2. At this time, the data held in the latch circuit 15 is output at the data output terminal DO. Then, by applying the data output clock UPCLK to the clock input terminal C1 of the latch circuit 15, the data held in the latch circuit 13 is captured in the latch circuit 15, and thus the data is updated.

[II] External Test

The input and output signals in the respective operations (CAPTURE, SHIFT and DATA OUTPUT) are the same as those at the internal test described before.

[III] Sample test (1) CAPTURE

In the same operation, a transmission path for normal data is the same as that in the normal operation. Therefore, the control circuit sets the control signal LT at the low level, and sets the data output clock UPCLK at the high level. The selector circuit 12 selects the data input D1 in response to the control signal LT at the low level. Thus, the signal input through the data input terminal DI is transmitted through the latch circuit 15 to the data output terminal DO. Then, the control circuit applies the capture clock CPCLK to the clock input terminal C1 of the latch circuit 13. The data from the output terminal of the selector circuit 12 is captured by the latch circuit 13. By a series of these operations, the data can be transmitted from the data input terminal DI to the data output terminal DO, and the data can be held in the latch circuit 13. Since this capture operation is performed by the clocks, which are output at the timing different from that in the normal operation, any influence is not exerted on the signals form the data input terminal DI to the data output terminal DO.

(2) SHIFT

The shift operation from the scan input terminal SI to the scan output terminal SO is carried out by the non-overlapped clocks SCLK1 and SCLK2 of two phases input from the control circuit 8. In this operation, the data which was captured in the latch circuit 13 at CAPTURE is shifted out.

(3) DATA OUTPUT

Since the sample operation is such an operation that the signal in the circuit during the normal operation is sampled at a given timing and is output from the chip by the shift operation, the update operation is not performed. Thus, the data output clock CPCLK is set at the high level and the data from the select circuit 12 is passed to the output terminal DO.

[IV] Normal Operation

The control circuit 8 sets the control signal LT, clock signals SCLK1, SCLK2, CPCLK and UPCLK at the low level, the selector circuit 12 selects the data input D1, and the latch circuits 13 and 14 stop the shift operations and function as data-through. Thus, the bus for transmitting the normal data is maintained, and any influence is not exerted on the normal operation.

FIG. 11 is a block diagram showing another embodiment of the invention, and FIG. 12 is a timing chart illustrating an operation thereof. This embodiment differs from that in FIG. 6 in that the data from the data input terminal DI is captured and the capture operation is performed in a latch circuit 45. For the purpose of it, the latch circuit 45 has two inputs and a latch circuit 46 has one input. Input/output waveforms in connection with the respective functions (CAPTURE, SHIFT and UPDATE) in the operations for the respective tests (internal test, external test and sample test) in these circuits are illustrated in FIG. 12. Compared with FIG. 10, it is the same except for the fact that it does not require the clock SCLK2 in CAPTURE because the data is captured directly in the latch circuit 45.

FIG. 13 is a block diagram showing still another embodiment. Referring to FIG. 13, it differs from the above embodiment in that, instead of the latch circuit 15, an AND gate 47 is connected to the output terminal DO. In such a structure, the data from the latch circuit 13 can be used to control the externally applied data output clock UPCLK. That is; the data output from the latch circuit 13 is selected by the selector circuit 12 and is input to the AND gate 47. The AND gate 47 processes this data applied from the latch circuit 13 and the data output clock UPCLK by AND operation, which enables the controlling of the clock externally applied.

FIG. 14 shows a structure which employs, instead of the AND gate 47 in said FIG. 13, an OR gate 48 of which input terminal is connected to an inverter 49. In this structure, the externally applied data output clock UPCLK can be controlled by the data of the latch circuit 13, similarly to the circuit in said FIG. 13.

Although, in the embodiments described hereinabove, level-sensitive circuits using the clocks of two phases are exemplified as the latch circuits, latch circuits employing edge trigger may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor apparatus comprising a one-chip semiconductor integrated circuit including a logic circuit, a plurality of register means coupled in a cascade to each other and each coupled to said logic circuit, control means coupled to said register means for generating control signals for controlling said register means, system data terminal means coupled to said register means for inputting/outputting system data thereto/therefrom, and test signal terminal means coupled to said control means for receiving and supplying a test signal to said control means, said control means comprising means responsive to said test signal for generating control signals for controlling said register means, said control signals including, a selection signal, a capture clock, a shift clock and a feed clock, each said register means comprising, (a) shift-in means responsive to said shift clock for shifting data from adjacent preceding register means to said register means, (b) selection means responsive to said selection signal for selecting between (i) data from said system data terminal or said logic circuit means and (ii) said data shifted from said adjacent preceding register means, (c) capture means coupled to said selecting means and responsive to said capture clock for capturing said selected data from said system data terminal or said logic circuit means, (d) shift-out means responsive to said shift clock for shifting said captured data from said register means to adjacent succeeding register means, and (e) data feeding means responsive only to said feed clock for feeding said selected data to said system data terminal means or said logic circuit means.

2. The semiconductor apparatus according to claim 1, wherein said control means includes decoding means for decoding the contents of said test signal, and test access port controlling means for varying the control signals to be applied to said plurality of register means depending on the decoded contents.

3. The semiconductor apparatus according to claim 2, wherein said test access port controlling means comprises means for generating a selection signal, a feed clock signal, a capture clock signal and a non-overlapped shift clock signal of two phases, to apply said selection signal, said feed clock signal and said capture clock signal to said register means and then apply said shift clock signal to said shift register means in a case (i) where the contents of said test signal are a sample test, and to apply only said selection signal and said feed clock signal to all said plurality of register means in a case (ii) where the contents of said test signal are a test of a path through which system data is transmitted.

4. The semiconductor apparatus according to claim 1, wherein
said shift-in means includes state storing means for temporarily storing applied data, and gate means responsive to said shift clock signal for applying the data shifted from the adjacent preceding register means to said state storing means.

5. The semiconductor apparatus according to claim 4, wherein
said capture means includes gate means connected to said selection means and responsive to said capture clock signal for applying the selected data to said state storing means of said shift-in means.

6. The semiconductor apparatus according to claim 1, wherein
said shift-out means includes state storing means for temporarily storing applied data, and gate means connected to said shift-in means and responsive to said shift clock signal for applying the data from said shift-in means to said state storing means.

7. The semiconductor apparatus according to claim 1, wherein
said capture means and said shift-out means include state storing means for temporarily storing applied data, first gate means connected to said selection means and responsive to said capture clock signal for applying the selected data to said state storing means, and second gate means connected to said shift-in means and responsive to said shift clock signal for applying the shifted data to said state storing means.

8. The semiconductor apparatus according to claim 1, wherein
said data feeding means includes state storing means for temporarily storing applied data, and gate means connected to said selection means and responsive to said feed clock signal for applying the selected data to said state storing means.

9. The semiconductor apparatus according to claim 1, wherein
said selection means includes first signal inversion means connected to said system data terminal or said logic circuit, second signal inversion means connected to said shift-in means, third signal inversion means supplied with said selection signal, gate means responsive to an output of said third signal inversion means for passing one of an output of said first signal inversion means and an output of said second signal inversion means, and fourth signal inversion means connected to an output of said gate means.

10. The semiconductor apparatus according to claim 1, wherein
said data feeding means includes means for ANDing said feed clock signal and said selected data.

11. The semiconductor apparatus according to claim 1, wherein
said data feeding means includes signal inversion means supplied with said feed clock signal, and means for ORing an output of said signal inversion means and said selected data.

12. A test circuit apparatus comprising a connection means in which a system connection is formed for transmitting system data and a test connection is formed for transmitting a test instruction signal which includes a test mode signal for indicating the contents of a test, test data and a test clock signal; and
a plurality of semiconductor integrated circuits connected to said connection means, each said semiconductor integrated circuit including:
control signal generator means for generating a control signal responsive to the test instruction signal input through said test connection for transmitting the test data;
a plurality of system data input/output terminals connected to said system connection;
processing means for processing the system data input and output through said system data input-/output terminals; and
test bus forming means connected between respective system data input/output terminals and the processing means and responsive to said control signal, for forming a test bus operatively connected to said test connection to transmit processed data which has been processed by said processing means or the test data,
said control signal generator means including clock signal generator means responsive to the test mode signal included in said test instruction signal for generating a select signal for making selection as to whether the data is applied to said processing means or to a test bus, a capture clock signal for capturing the processed data processed by said processing means, a first shift clock signal for transmitting the test data of the processed data to the test bus, the second shift clock signal and an updated clock signal for applying the test data to said system data output terminal or said processing means; and
said test bus forming means including,
first latch means responsive to said first shift clock signal for outputting shifted-in data,
second latch means connected to an output of said first latch means and responsive to said second shift clock signal for outputting an output of said first latch means to the test bus,
selector means connected to the output of said first latch means and either the output of said processing means or the system data input terminal, and responsive to said select signal for selecting the output of said first latch means and either the output of said processing means or the system data input,
third latch means connected to an output of said selector means and responsive to said capture clock signal for outputting output data of said selector means to the test bus, and
data output means connected to the output of said selector means and responsive to said update clock signal for outputting the output data of said selector means to either the system data output terminal or said processing means.

13. A method of operating a semiconductor apparatus comprising a semiconductor integrated circuit including a logic circuit, a plurality of register means coupled in cascade to each other and each coupled to said logic circuit, system data terminal means coupled to said register means for inputting/outputting system data thereto/therefrom, and test signal terminal means for receiving a test signal, said method comprising the steps of:
in response to said test signal, generating a register control signal for controlling said register means, said control signal including, as components thereof, (a) a selection signal, (b) a capture clock signal, (c) a shift clock signal, and (d) a feed clock signal;

in response to said selection signal component, selecting either said system data or said test data;

responding to said capture clock signal component by capturing selected system data and shifting said captured system data to next adjacent register means in response to said shift clock signal component; and responding to said feed clock signal component by feeding said selected test data to said logic circuit means and shifting said test signal to said next adjacent register means in response to said shift clock signal component.

14. A method of operating a semiconductor apparatus comprising a semiconductor integrated circuit including a logic circuit, a plurality of register means coupled in cascade to each other and each coupled to said logic circuit, system data terminal means coupled to said register means for inputting/outputting system data thereto/therefrom, and test signal terminal means for receiving a test signal, said method comprising the steps of:

(a) in response to said test signal, generating a register control signal for controlling said register means, said control signals including (i) a selection signal, (ii) a capture clock signal, (iii) a shift clock signal and (iv) a feed clock signal;

(b) in response to said shift clock signal, shifting data from adjacent preceding register means to said shift register means;

(c) in response to said selection signal, selecting between (i) data from said system data terminal or said logic circuit and (ii) said data shifted from adjacent preceding register means;

(d) in response to said capture clock signal, capturing said selected system data or said data from said logic circuit;

(e) in response to said shift clock signal, shifting said captured data from said register means to adjacent succeeding register means; and (f) in response only to said feed clock signal, feeding said selected data to said system data terminal means or said logic circuit.

* * * * *